(12) United States Patent
Wu et al.

(10) Patent No.: US 9,269,546 B2
(45) Date of Patent: Feb. 23, 2016

(54) PLASMA REACTOR WITH ELECTRON BEAM PLASMA SOURCE HAVING A UNIFORM MAGNETIC FIELD

(71) Applicant: APPLIED MATERIALS, INC., Santa Clara, CA (US)

(72) Inventors: Ming-Feng Wu, San Jose, CA (US); Ajit Balakrishna, Sunnyvale, CA (US); Leonid Dorf, San Jose, CA (US); Shahid Rauf, Pleasanton, CA (US); Kenneth S. Collins, San Jose, CA (US); Nipun Misra, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 262 days.

(21) Appl. No.: 13/945,200

(22) Filed: Jul. 18, 2013

(65) Prior Publication Data

US 2014/0035458 A1 Feb. 6, 2014

Related U.S. Application Data

(63) Continuation-in-part of application No. 13/097,800, filed on Apr. 29, 2011, now Pat. No. 8,773,020.

(60) Provisional application No. 61/405,970, filed on Oct. 22, 2010.

(51) Int. Cl.
*H01J 37/32* (2006.01)

(52) U.S. Cl.
CPC ....... *H01J 37/32669* (2013.01); *H01J 37/3233* (2013.01)

(58) Field of Classification Search
CPC . H01J 37/32; H01J 37/3266; H01J 37/32669; H01J 37/3233; H01J 37/32376; H01J 2237/082; H01J 2237/1215; H01J 2237/14
USPC ............ 315/111.21, 111.41, 111.51, 111.71, 315/111.81, 11.91, 345.1, 345.46, 345.51
See application file for complete search history.

(56) References Cited

U.S. PATENT DOCUMENTS

| | | | |
|---|---|---|---|
| 4,829,215 | A | 5/1989 | Kim et al. |
| 4,842,683 | A | 6/1989 | Cheng et al. |
| 5,215,619 | A | 6/1993 | Cheng et al. |
| 5,449,977 | A | 9/1995 | Nakagawa et al. |

(Continued)

FOREIGN PATENT DOCUMENTS

| | | |
|---|---|---|
| CN | 1545722 A | 11/2004 |
| JP | 3115561 A | 5/1991 |

(Continued)

OTHER PUBLICATIONS

Official Action Dated Nov. 15, 2013 Issued in Co-Pending U.S. Appl. No. 13/097,800.

(Continued)

*Primary Examiner* — Douglas W Owens
*Assistant Examiner* — Thai Pham
(74) *Attorney, Agent, or Firm* — Robert M. Wallace

(57) ABSTRACT

Electron beam-confining electromagnets of an electron beam generator are aligned with an electron beam axis, each of the electromagnets being folded to define a main section and a pair of angled wing sections disposed at respective angles relative to said main section, and a conductor wound around the edge.

17 Claims, 18 Drawing Sheets

(56) References Cited

U.S. PATENT DOCUMENTS

| | | |
|---|---|---|
| 5,534,108 A | 7/1996 | Qian et al. |
| 5,717,294 A | 2/1998 | Sakai et al. |
| 6,015,476 A | 1/2000 | Schlueter et al. |
| 6,113,731 A | 9/2000 | Shan et al. |
| 6,545,580 B2 | 4/2003 | Hegde et al. |
| 6,716,302 B2 | 4/2004 | Carducci et al. |
| 6,805,770 B1 | 10/2004 | Oster |
| 6,937,127 B2 | 8/2005 | Oster |
| 7,316,199 B2 * | 1/2008 | Horioka et al. ............ 118/723 R |
| 7,374,636 B2 | 5/2008 | Horioka et al. |
| 7,422,654 B2 | 9/2008 | Lindley et al. |
| 7,686,926 B2 * | 3/2010 | Gung et al. ............... 204/192.15 |
| 7,879,186 B2 | 2/2011 | Lindley et al. |
| 7,883,633 B2 | 2/2011 | Lindley et al. |
| 8,048,328 B2 | 11/2011 | Lindley et al. |
| 2004/0084151 A1 | 5/2004 | Kim |
| 2004/0168771 A1 | 9/2004 | Mitrovic |
| 2004/0182516 A1 | 9/2004 | Lindley et al. |
| 2006/0192150 A1 | 8/2006 | Demos et al. |
| 2008/0277063 A1 | 11/2008 | Shin |
| 2012/0097870 A1 | 4/2012 | Leray et al. |
| 2013/0206725 A1 * | 8/2013 | Leeser et al. .................... 216/67 |

FOREIGN PATENT DOCUMENTS

| | | |
|---|---|---|
| JP | 2004104095 A | 4/2004 |
| KR | 2001-0069270 A | 7/2001 |
| TW | I293855 B | 2/2008 |

OTHER PUBLICATIONS

Official Action Dated Feb. 7, 2013 Issued in Corresponding U.S. Appl. No. 13/097,800.

Official Action Dated Jul. 22, 2013 Issued in Corresponding U.S. Appl. No. 13/097,800.

Official Action Dated Oct. 16, 2013 Issued in Corresponding U.S. Appl. No. 13/097,800.

* cited by examiner

PLASMA REACTOR WITH ELECTRON BEAM PLASMA SOURCE HAVING A UNIFORM MAGNETIC FIELD

CROSS-REFERENCE TO RELATED APPLICATIONS

This application is a continuation-in-part of U.S. patent application Ser. No. 13/097,800, filed Apr. 29, 2011, now U.S. Pat. No. 8,773,020 entitled APPARATUS FOR FORMING A MAGNETIC FIELD AND METHODS OF USE THEREOF, by Gary Leray et al., which claims benefit of U.S. Provisional Application Ser. No. 61/405,970, filed Oct. 22, 2010 entitled APPARATUS FOR FORMING A MAGNETIC FIELD AND METHODS OF USE THEREOF, by Gary Leray, et al.

BACKGROUND

1. Technical Field

Embodiments of the present invention generally relate to plasma enhanced substrate processing.

2. Background Discussion

Plasma enhanced substrate processing is commonly used, for example, in the manufacture of semiconductor devices and integrated circuits. Such processing generally includes introducing a process gas into a process chamber having a substrate, such as a semiconductor wafer, disposed therein and applying sufficient energy to the process gas to form a plasma over the substrate. The plasma contains dissociated and ionized components as well as neutral components that operate to assist the process being performed on the substrate (such as deposition, etching, and the like). Although the constituents of the plasma are beneficial for assisting or carrying out the process on the substrate, unconstrained plasma components may impinge on the substrate and/or chamber components causing damage. In addition, plasma non-uniformities may lead to non-uniform processing of substrates.

To control the plasma, conventional process chambers may include a magnetic field-forming device configured to produce a magnetic field within the process chamber to constrain plasma components. However, the magnetic field produced by such conventional configurations typically comprise non-parallel and non-planar magnetic field lines, resulting in non-uniform plasma confinement, and therefore, non-uniform processing of the substrate.

SUMMARY

A plasma reactor includes a processing chamber, an electron source having an electron emission axis extending into the processing chamber, and a pair of electron beam-confining electromagnets aligned with the electron emission axis. Each of the electromagnets includes a conductor coiled around a closed boundary, the closed boundary comprising an edge folded to define a main section and a pair of angled wing sections disposed at respective angles relative to the main section, the boundary defining an aperture through which the electron emission axis extends. The conductor is confined in a zone along the edge of the frame defining an aperture extending between opposite edges of the frame, the electron beam axis extending through the aperture of one of the electromagnets.

In a further aspect, there are provided first and second DC current sources coupled to first and second ones of the electromagnets respectively, and a controller governing the first and second DC current sources.

In one embodiment, the electron beam source provides an electron beam having a width less than a distance between opposing edges of the angled wing sections. In a related embodiment, the width of the electron beam exceeds a width of the main section.

In a related embodiment, the angled wing sections are folded about respective fold axes which are parallel to an axis of symmetry of the chamber.

In a further embodiment, each of the pair of electromagnets extends around portion of a periphery of the chamber. In one aspect, the pair of electromagnets defines respective portions of a polygon within which a circular boundary of the processing chamber is inscribed.

In a further embodiment, each angled wing section of one of the electromagnets is separated by a gap from the corresponding angled wing section of the other one of the electromagnets.

In accordance with a related embodiment, there is provided respective pairs of side electromagnets extending at least partially across respective ones of the gaps, each of the side electromagnets extending from a corresponding one of the angled wing sections into the gap.

In one aspect, each one of the pair of side electromagnets extends across the entirety of the corresponding one of the gaps.

Each of the side electromagnets is oriented at an angle relative to the electron emission axis.

In one embodiment, the pair of electromagnets and the side electromagnets together define a complete polygon within which a circular boundary of the processing chamber is inscribed.

The reactor may further include respective DC current sources coupled to respective ones of the side electromagnets. In a related aspect, the DC current sources are such that current flow direction along a top edge of each electromagnet is co-directional with current flow along the top edge of the corresponding one of the folded wing sections.

In a related aspect, the electron beam source extends partially into the aperture.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
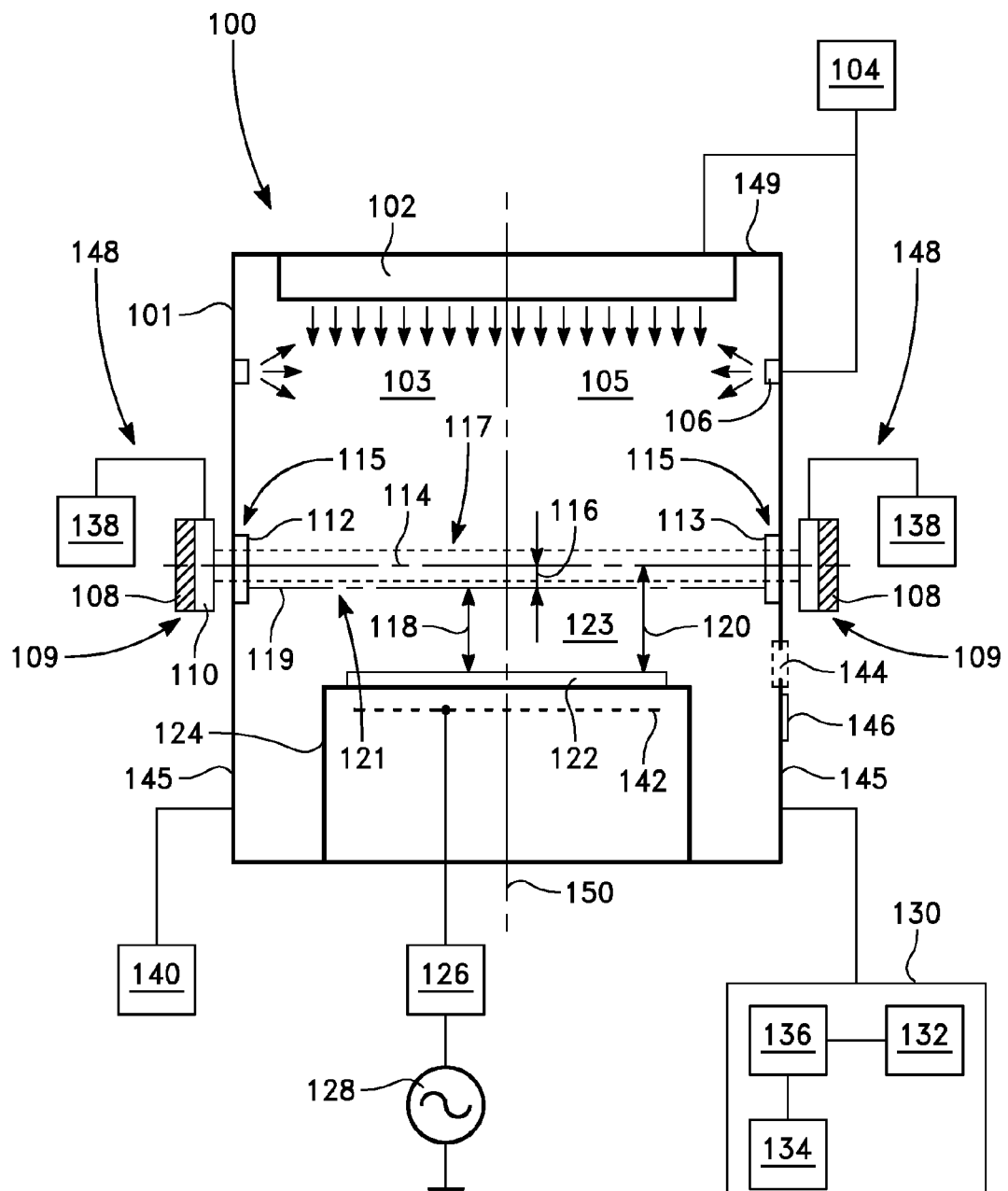
FIG. 1 depicts a schematic side view of a process chamber having an apparatus for controlling a plasma in accordance with some embodiments of the present invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally relate to an apparatus for controlling a plasma and methods of use thereof. Embodiments of the inventive apparatus and methods may advantageously allow for substantially planar and parallel magnetic field to be formed in multiple directions, thereby providing an increased flexibility in plasma processing. In addition, the inventive apparatus provides a coil configuration of comparatively small volume about a process chamber as opposed to conventional coil configurations (e.g. a Helmholtz coil configuration). Embodiments of the inventive apparatus and methods may further advantageously more uniformly constrain a plasma formed within a process chamber, thereby leading to more uniform processing results.

FIG. 1 depicts a process chamber 100 suitable for use with an apparatus for forming a magnetic field in accordance with some embodiments of the present invention. Exemplary process chambers may include the DPS®, ENABLER®, ADVANTEDGE™, or other process chambers, available from Applied Materials, Inc. of Santa Clara, Calif. Other suitable process chambers may similarly be used.

The process chamber 100 generally comprises a chamber body 101 defining an inner volume 103 that may include a processing volume 105. The processing volume 105 may be defined, for example, between a substrate support pedestal 124 disposed within the process chamber 100 for supporting a substrate 122 thereupon during processing and one or more gas inlets, such as a showerhead 102 and/or nozzles 106 provided at desired locations. In some embodiments, the substrate support pedestal 124 may include a mechanism that retains or supports the substrate 122 on the surface of the substrate support pedestal 124, such as an electrostatic chuck, a vacuum chuck, a substrate retaining clamp, or the like (not shown). In some embodiments, the substrate support pedestal 124 may include mechanisms for controlling the substrate temperature (such as heating and/or cooling devices, not shown) and/or for controlling the species flux and/or ion energy proximate the substrate surface.

For example, in some embodiments, the substrate support pedestal 124 may include an RF bias electrode 142. The bias electrode 142 may be coupled to one or more bias power sources (one bias power source 128 shown) through one or more respective matching networks (matching network 126 shown). The one or more bias power sources may provide RF or DC energy in a pulsed or continuous mode. For example, in some embodiments, the one or more bias power sources may be capable of producing up to 12,000 W of RF energy at a desired frequency, such as about 2 MHz, or about 13.56 MHz, or about 60 MHz, or the like. In some embodiments, two or more bias power sources may be provided for coupling RF power through respective matching networks to the RF bias electrode 142 at respective frequencies of, for example, any of the frequencies discussed above. One or more of the bias power sources may provide either continuous or pulsed power. In some embodiments, the one or more bias power sources 128 may be a DC or pulsed DC source.

The substrate 122 may enter the process chamber 100 via an opening 144 in a wall 145 of the chamber body 101. The opening 144 may be selectively sealed via a slit valve 146, or other mechanism for selectively providing access to the interior of the chamber through the opening 144. The substrate support pedestal 124 may be coupled to a lift mechanism (not shown) that may control the position of the substrate support pedestal 124 between a lower position suitable for transferring substrates into and out of the chamber via the opening 144 and a selectable upper position suitable for processing. The process position may be selected to maximize process uniformity for a particular process. When in at least one of the elevated processing positions, the substrate support pedestal 124 may be disposed above the opening 144 to provide a symmetrical processing region.

The showerhead 102 and/or nozzles 106 may be coupled to a gas supply 104 for providing one or more process gases into the processing volume 105 of the process chamber 100. Although only two nozzles 106 are shown in FIG. 1 disposed on the walls 145 of the chamber body 101, additional or alternative gas nozzles or inlets may be disposed in the ceiling 149 or on the walls 145 of the chamber body 101 or at other locations suitable for providing gases as desired to the process chamber 100, such as the base of the process chamber 100, the periphery of the substrate support pedestal 124, or the like. An exhaust system 140 comprising a vacuum pump (not shown) may be coupled to the process chamber 100 for pumping out the exhaust gases from the inner volume 103.

In some embodiments, the process chamber 100 may utilize an electron beam generator 115 to generate an electron beam 121 to ignite a process gas (e.g. a process gas provided by gas supply 104) to form a plasma in the processing volume 105. For example, in such embodiments the process chamber 100 may comprise a cathode 112 disposed on a wall 145 of the chamber body 101 and configured to produce electrons having an adequate amount of energy to ignite the process gas.

An anode 113 may be disposed on a wall 145 opposite the cathode 112 and configured to attract the electrons produced by the cathode 112.

The electron beam generator 115 may be disposed at any position within the process chamber 100 to provide the electron beam 121 at a suitable distance from the substrate 122 to perform a desired process. For example, in some embodiments, the electron beam generator 115 may be positioned such that a distance 118 between a central axis 119 of the electron beam 121 and an upper surface of the substrate 122 may be about 1 cm to about 30 cm. In some embodiments, the distance 118 may be selected to adjust the plasma density in an area 123 proximate the substrate. For example, as the distance 118 between the central axis 119 of the electron beam 121 and the substrate 122 decreases the density of the plasma in the area 123 proximate the substrate 122 may increase. Alternatively, as the distance 118 between the central axis 119 of the electron beam 121 and the substrate 122 increases, the density of the plasma in the area 123 proximate the substrate 122 may decrease.

A magnetic field forming device 148 (described more fully below with respect to FIGS. 2-4) is disposed proximate the walls 145 of the chamber body 101 and configured to form a magnetic field 117 having magnetic field lines that are substantially planar and substantially parallel to facilitate control over the plasma formed in the processing volume 105. The magnetic field forming device 148 generally comprises a plurality of coils 110 positioned symmetrically about a central axis 150 of the process chamber 100. The magnetic field forming device 148 may comprise any amount of coils 110 suitable for forming a magnetic field (i.e., magnetic field 117) having the desired shape and orientation.

One or more power supplies 138 may be coupled to the plurality of coils 110 to selectively provide an electric current through one or more of the plurality of coils 110 to produce the desired magnetic field 117 within the process chamber 100. In operation, the magnetic field 117 confines at least some of the electrons (negatively charged particles) of the electron beam 121 and/or the plasma, thereby facilitating control over the plasma.

In some embodiments, a shield 108 may be disposed around the plurality of coils 110 to shield other equipment (e.g., controllers, process chambers, other fabrication equipment, or the like) from the magnetic field 117. The shield 108 may comprise any material suitable to impede the magnetic field 117, such as a metal, for example stainless steel. In addition, the shield 108 may have any suitable geometry (e.g., size and shape) that provides the desired shielding effect. For example, in some embodiments, the shield 108 may be sized to cover an outer facing surface 109 of the plurality of coils 110. The shield 108 may be continuous and extend from coil to coil, or alternatively, the shield 108 may comprise a plurality of discrete elements disposed proximate each individual coil (or groups of coils). The shield 108 may be in direct contact with the coils or may be spaced apart from the coils.

The magnetic field forming device 148 may be disposed at any position about the process chamber 100 to provide the magnetic field 117, and therefore control the plasma, in a suitable location with respect to the substrate 122. For example, in some embodiments, the magnetic field forming device 148 may be positioned such that a distance 120 between a central axis 114 of the magnetic field 117 and the substrate 122 may be about 1 cm to about 30 cm In some embodiments, the distance 120 may be selected to adjust the plasma density in an area 123 proximate the substrate. For example, as the distance 120 between the central axis 114 of the magnetic field 117 and the substrate 122 decreases the density of the plasma in the area 123 proximate the substrate 122 may increase. Alternatively, as the distance 120 between the central axis 114 of the magnetic field 117 and the substrate 122 increases, the density of the plasma in the area 123 proximate the substrate 122 may decrease.

In addition, the position of the magnetic field forming device 148 and the electron beam generator 115 may be selected to adjust a distance 116 between the central axis 114 of the magnetic field 117 and the central axis 119 of the electron beam 121. In some embodiments, by varying the distance 116 between the central axis 114 of the magnetic field 117 and the central axis 119 of the electron beam 121, the amount of electrons of the electron beam 121 confined to a given plane may be adjusted. In some embodiments, the inventors have observed as the distance 116 between the central axis 114 of the magnetic field 117 and the central axis 119 of the electron beam 121 is decreased more of the electrons of the electron beam 121 are confined to a given plane, thus increasing the confinement (and reducing or eliminating divergence) of the electron beam 121, thereby preventing electrons from the electron beam 121 from impinging on the substrate 122. For example, in some embodiments the distance 116 between the central axis 114 of the magnetic field 117 and the central axis 119 of the electron beam 121 may be up to about a thickness of the electron beam 121.

Figure 2:
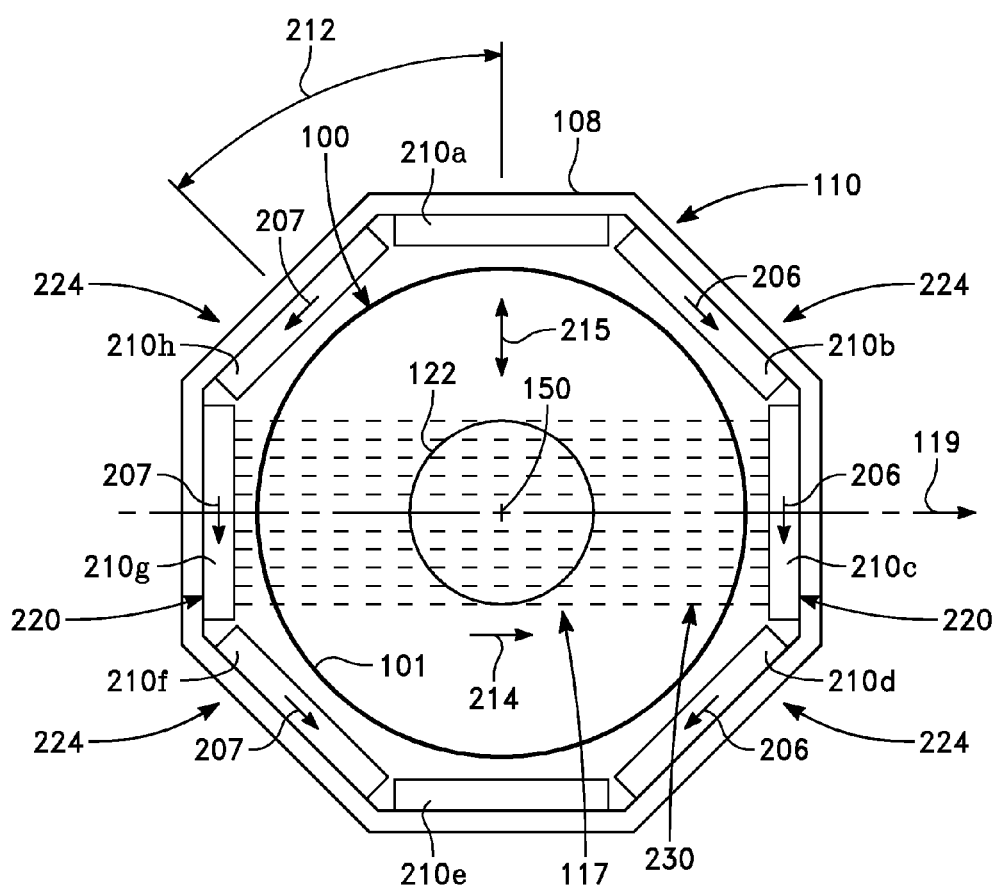
FIG. 2 is a top view of an apparatus for controlling a plasma in accordance with some embodiments of the present invention.

Referring to FIG. 2, in some embodiments, the plurality of coils 110 may comprise eight coils 210a-h disposed about the central axis 150 of the process chamber 100. In such embodiments, the eight coils 210a-h may be arranged in a symmetrical pattern wherein each of the eight coils 210a-h is offset by an angle 212 of about 45 degrees from a respective adjacent coil of the eight coils 210a-h. In some embodiments, each coil may have a substantially similar size, shape, and strength (e.g., number of turns of wire forming the coil).

In operation, subsets of the plurality of coils 110 may be utilized to form the magnetic field 117 having a desired shape and orientation in a desired vector direction. For example, in some embodiments, six coils (i.e., coils 210b, 210c, 210d, 210f, 210g, 210h) of the eight coils 210a-h may be utilized to form the magnetic field 117. For example, in such embodiments, a first current may be provided to a first group of coils (primary coils 220) comprising two coils 210c, 210g to generate the magnetic field 117 having magnetic field lines 230 oriented in a vector direction 214.

The first current may flow in opposite directions with respect to the opposing coils. For example, the first current may be applied in a first direction 206 about a first coil (e.g., coil 210c) of the primary coils 220 and in a second direction 207 opposite the first direction 206 about a second coil (e.g., coil 210g) of the primary coils 220. The arrows depicting the first direction 206 and the second direction 207 schematically indicate the general direction of current flow across the top of the respective coils. Since the coils 210c and 210g are opposing, the first direction 206 and the second direction 207 both are illustratively moving down the page in the frame of reference of FIG. 2. Alternatively, the opposing coils may be wound in opposite directions to cause the current to flow in opposite directions.

A second current may be concurrently provided to a second group of coils (secondary coils 224) adjacent to the first group of coils (for example, four coils 210b, 210d, 210f, 210h) to cause the magnetic field lines to be substantially planar and substantially parallel throughout a region of the magnetic field disposed above substrate support of the process chamber. For example, the magnetic field lines created by the second group of coils may compress the magnetic field lines created by the first group of coils with respect to a direction 215 perpendicular to the vector direction 214. The second current may be applied in the first direction 206 about secondary coils adjacent to the primary coil that also has current flowing in the first direction (e.g., primary coil 210c and secondary coils 210b, 210d). The second current may be applied in the second direction 207 about secondary coils adjacent to the primary coil that also has current flowing in the second direction (e.g., primary coil 210g and secondary coils 210f, 210h). By providing the plurality of coils 110 in the manner and operation described above, the inventors have observed that the desired magnetic field 117 may be formed using the magnetic field forming device 148 configured in a comparatively small volume about a process chamber as opposed to conventional coil configurations (e.g. a Helmholtz coil configuration).

In some embodiments, a ratio of the first current to the second current may be varied to control the shape and/or contours of the magnetic field lines 230 within the magnetic field 117 in the plane parallel to the substrate 122 to compensate for plasma effects. For example, the ratio of the first current to the second current may be about 2:1 to about 1:5. In some embodiments, the inventors have observed if the ratio is higher towards the first current, the magnetic field lines 230 in the plane parallel to the substrate 122 may be convex (i.e., divergent). Alternatively, in some embodiments, if the ratio is higher towards the second current, the magnetic field lines 230 in the plane parallel to the substrate 122 may be concave (i.e., convergent).

Figure 5A:
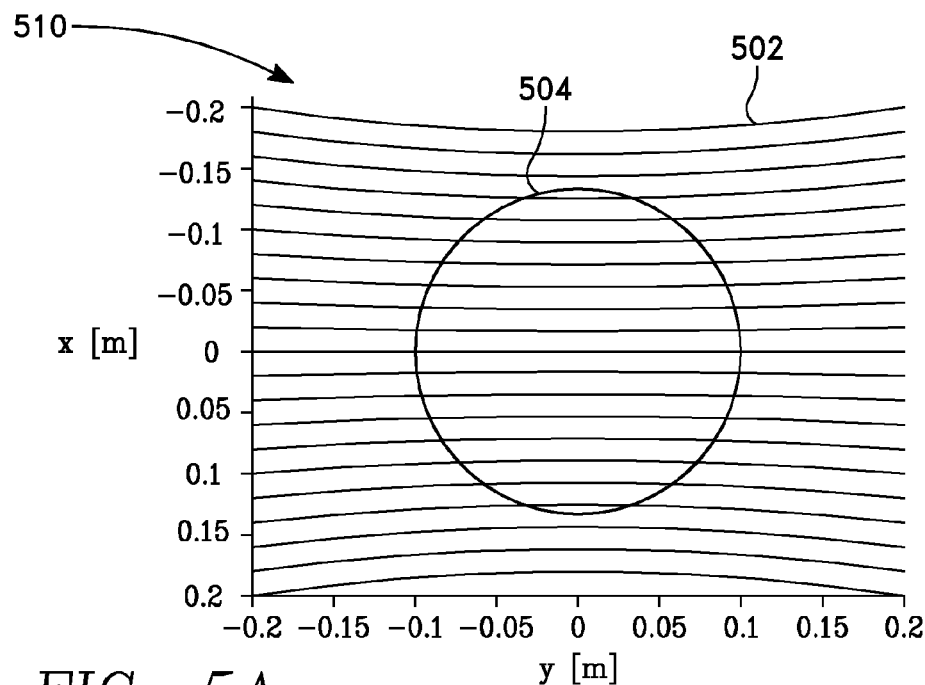
FIGS. 5A-5C depicts a graph showing top views of magnetic field lines superimposed over a substrate in accordance with some embodiments of the present invention.
Figure 5B:
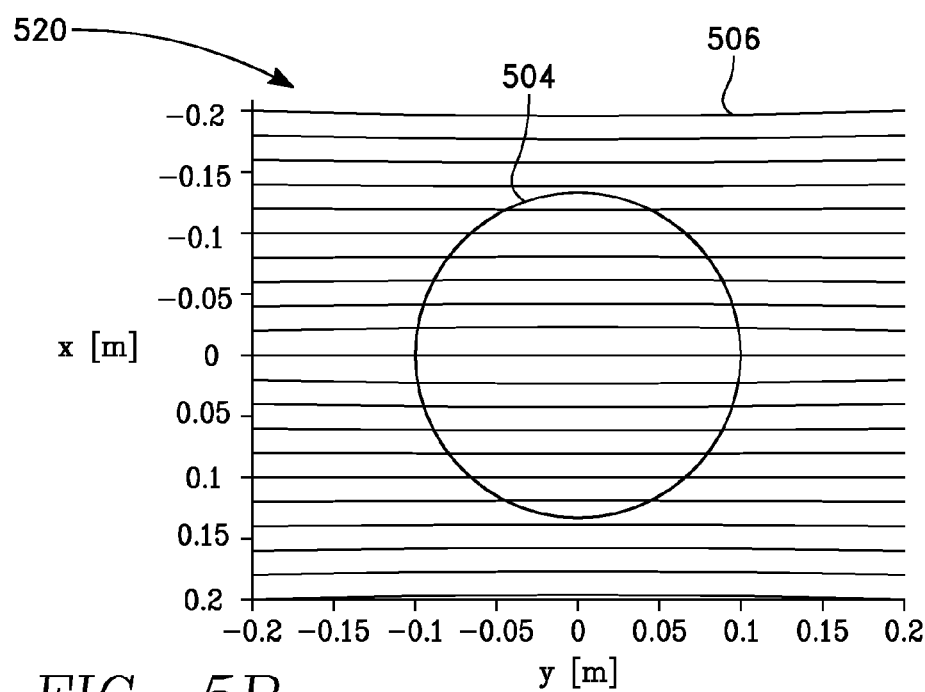
Figure 5C:
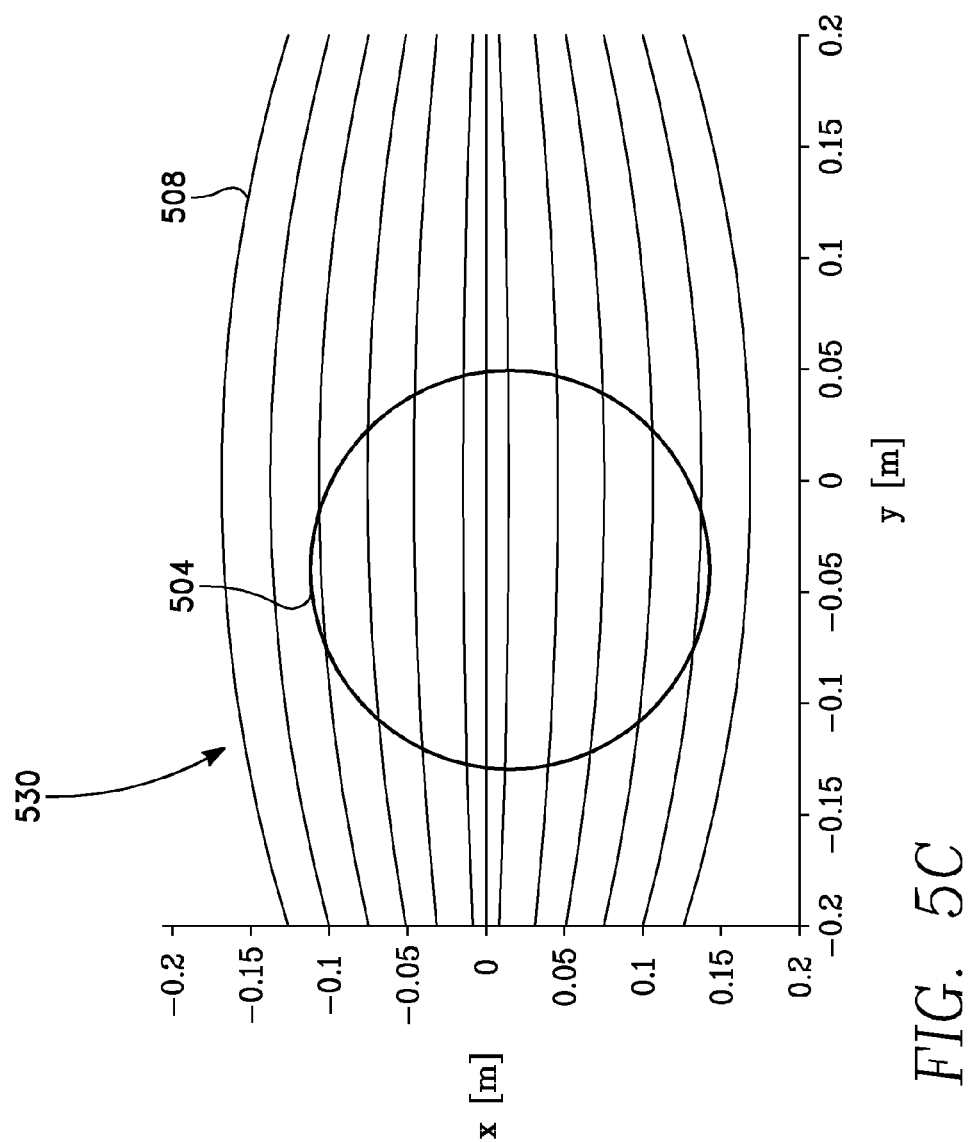

For example, FIGS. 5A-5C respectively depict top views of the shape of magnetic field lines created at three different ratios of the first current to the second current. FIG. 5A depicts a graph 510 showing a top view of magnetic field lines 502 superimposed over a substrate 504 where the ratio of the first current to the second current is about 1:1. As shown in FIG. 5A, the magnetic field lines 502 are generally parallel over the predominant portion of the substrate 504, although the magnetic field lines 502 near the outer edges, or outer region, of the magnetic field are slightly curved outward (e.g., concave). The magnetic field lines 502 proximate the outer region of the magnetic field may have a greater radius of curvature than that of the magnetic field lines 502 proximate a central axis of the magnetic field.

FIG. 5B depicts a graph 520 showing a top view of magnetic field lines 506 superimposed over a substrate 504 where the ratio of the first current to the second current is about 2:1. As shown in FIG. 5B, the magnetic field lines 506 are generally parallel over the predominant portion of the substrate 504, and the magnetic field lines 506 near the outer edges, or outer region, of the magnetic field are much less curved (e.g., concave).

FIG. 5C depicts a graph 530 showing a top view of magnetic field lines 508 superimposed over a substrate 504 where the ratio of the first current to the second current is about 1:5. As shown in FIG. 5C, the magnetic field lines 508 are generally parallel over the predominant portion of the substrate 504, and the magnetic field lines 508 near the outer edges, or outer region, of the magnetic field are slightly curved inward (e.g., convex).

Returning to FIG. 2, in some embodiments, the magnitude of the magnetic field 117 may be varied by to tune the uniformity of a plasma formed within the process chamber 100. In some embodiments, the magnitude of the magnetic field 117 may be varied by increasing or decreasing the first current and second current. Alternatively, or in combination, the magnitude of the magnetic field 117 may be varied by increasing or decreasing an amount of a conductor wound about a core (e.g. a number of turns) when constructing of the plurality of coils 110 (for example, as described below with respect to FIG. 4.) In some embodiments, the magnetic field 117 may comprise a magnitude of about 44 to 52 Gauss, or in some embodiments about 60 to 70 Gauss. In some embodiments, by increasing or decreasing the magnitude of the magnetic field 117, a radius of the circular motion of the electrons formed in the plasma with respect to a plane perpendicular to the magnetic field 117 (i.e., the Larmor radius) may be increased or decreased. For example, as the magnitude of the magnetic field 117 is increased, the Larmor radius may decrease which reduces the electron divergence due to collisions with other particles.

Although the above embodiments are described with respect to forming a magnetic field 117 having magnetic field lines 230 orientated in vector direction 214, it is to be noted that the magnetic field 117 may be formed in other directions by utilizing any six of the eight coils 210a-h in a manner similar to that described above.

Figure 3:
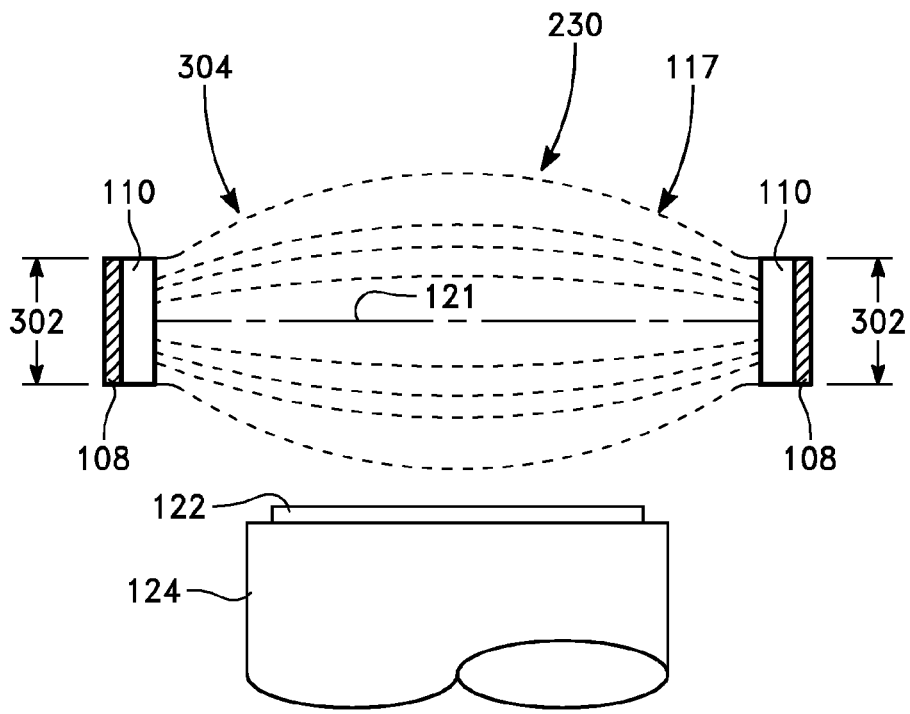
FIGS. 3 and 3A depict side views of an apparatus for controlling a plasma in accordance with some embodiments of the present invention.
Figure 3A:
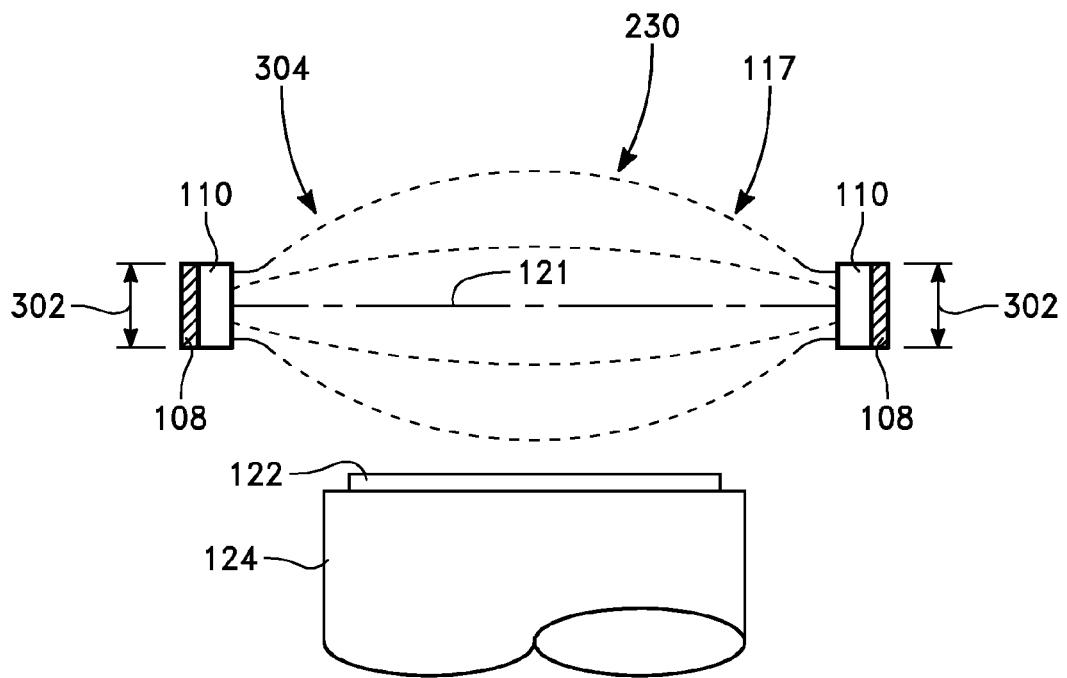

Referring to FIGS. 3 and 3A, in some embodiments, a height 302 of the plurality of coils 110 may be varied to adjust a magnetic field line 230 divergence (i.e., the density of magnetic field lines) in a given volume 304 about the electron beam 121. For example, the inventors have observed that as the height 302 of the plurality of coils 110 increases, the magnetic field line 230 divergence in a given volume around the substrate decreases, resulting in the magnetic field line 230 becoming increasingly parallel proximate the electron beam 121, for example such as depicted in FIG. 3. Alternatively, as the height 302 of the plurality of coils 110 decreases, the magnetic field line 230 divergence in a given volume around the substrate increases, resulting in the magnetic field line 230 becoming less parallel proximate the electron beam 121, for example such as depicted in FIG. 3A.

Figure 4:
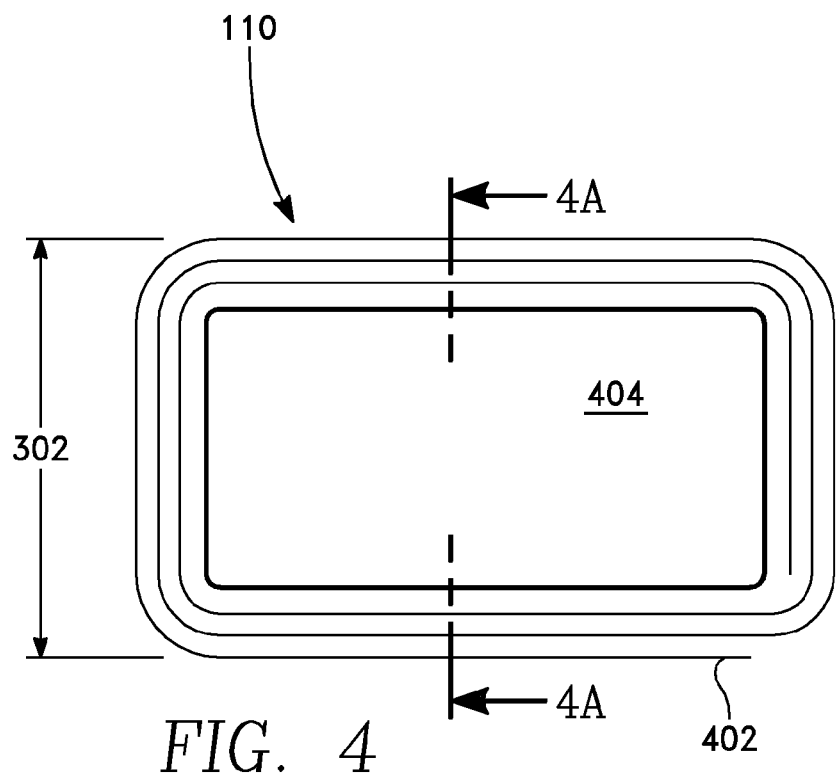
FIGS. 4 and 4A respectively depict a schematic side view and cross section along line 4A-4A of a coil for use with an apparatus for controlling a plasma in accordance with some embodiments of the present invention.
Figure 4A:
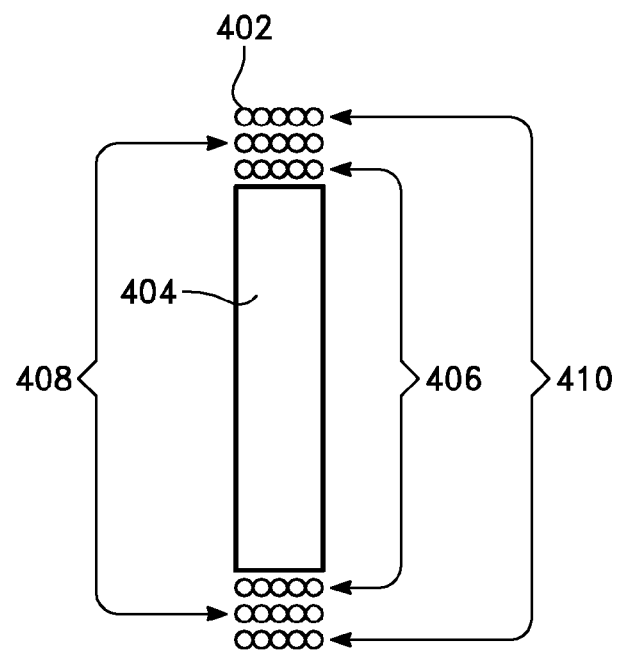

The plurality of coils 110 may comprise any shape suitable to produce the desired magnetic field 117. For example, in some embodiments, the plurality of coils 110 may be a rectangular toroid, as depicted in FIGS. 4-4A. In some embodiments, each coil of the plurality of coils 110 may comprise a conductor 402 (e.g., a wire comprising copper) wound in a desired shape a number of times (e.g., turns or windings). The conductor 402 is covered by an insulating layer (not shown) to electrically isolate adjacent portions of the conductor 402 between turns. For example, FIGS. 4-4A illustratively depict the conductor 402 having three layers (e.g., 406, 408, 410) with each layer having five turns of the conductor 402 (as shown in the cross-sectional side view of FIG. 4A). The size, number, and spacing of the conductor 402 and the layers 406, 408, 410 in the figures are not drawn to scale and simplified for illustrative purposes. Other numbers of turns, layers, geometries, etc. may be used as required to provide a desired magnetic field shape and strength. In some embodiments, the conductor 402 may be wound about an optional core 404.

In some embodiments, the core 404 may comprise a ferromagnetic material (e.g., cobalt (co), iron (Fe), nickel (Ni), or the like). The number of turns or windings of the conductor 402 may be varied to increase or decrease the magnitude of the magnetic field produced by the plurality of coils 110.

Figure 6:
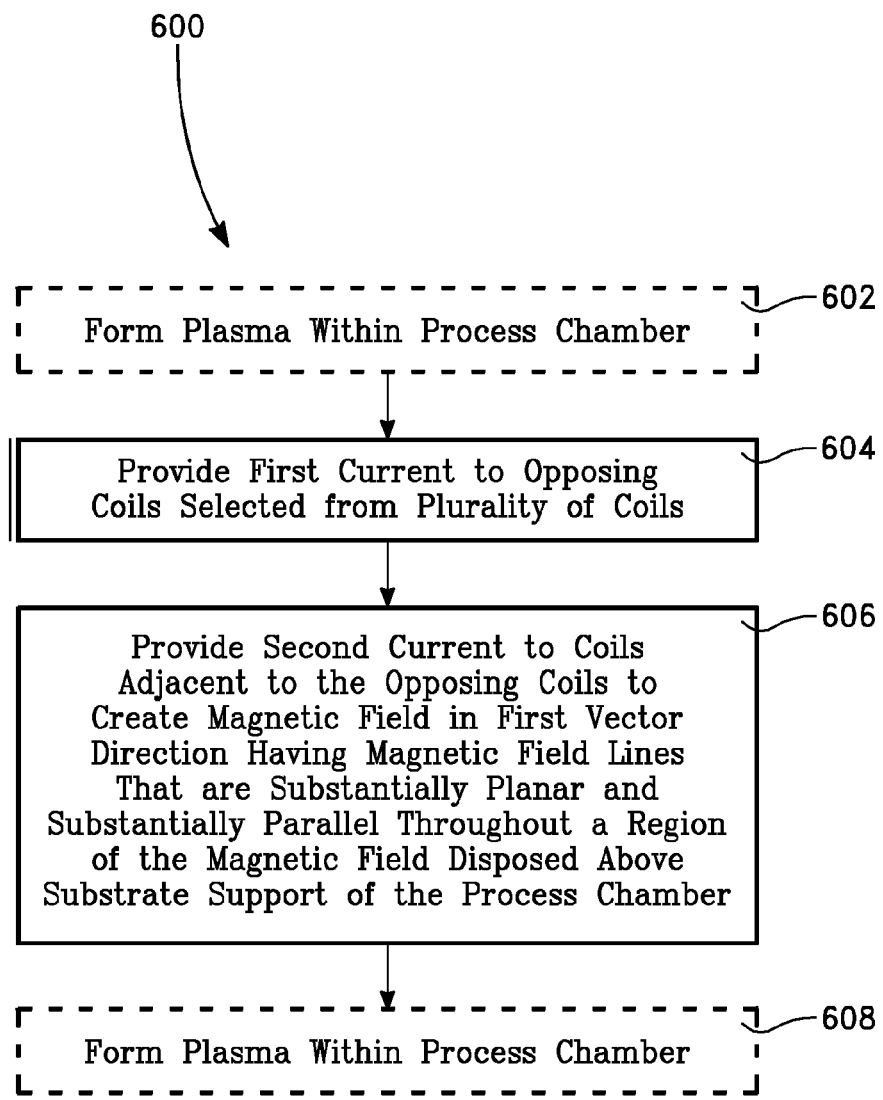
FIG. 6 depicts a method performed in a process chamber in accordance with some embodiments of the present invention.

FIG. 6 depicts a method performed in a process chamber in accordance with some embodiments of the present invention. The method 600 may be performed in any suitable process chamber comprising a plurality of coils having substantially similar dimensions disposed symmetrically about an exterior of the process chamber with respect to a central axis of the process chamber, for example such as the process chamber 100 comprising the magnetic field forming device 148 described above with respect to FIG. 1.

In some embodiments, the method 600 may be utilized to create a magnetic field to confine a plasma formed within a process chamber. Accordingly, in some embodiments, the method 600 may comprise forming a plasma within the process chamber. The plasma may be formed at any time during the method 600, for example such as the beginning of the method 600 at 602, at the end of the method 600 at 608, or at any time between.

In embodiments where the method 600 is performed in a process chamber similar to the process chamber 100 described above, to form the plasma a process gas may be supplied from the gas supply 104 to the processing volume 105 of the process chamber 100 via the showerhead 102 and/or nozzles 106. The process gas may be any process gas suitable to perform a desired process. Following the introduction of the process gas to the process chamber 100, the plasma may be formed by igniting the process gas via an electron beam 121 supplied by the electron beam generator 115, for example, as discussed above.

Next, at 604, a first current is provided to two opposing coils selected from the plurality of coils to create a magnetic field in a first vector direction. The two coils may be any two coils disposed on directly opposing sides of the magnetic field forming device to provide the magnetic field in a desired vector direction, as discussed above. The amount of current provided to the two coils 210c, 210g may be any amount suitable to produce the magnetic field 117 having a desired magnitude. In some embodiments, the amount of current required may be dictated by the size (e.g., the height 302 described in FIG. 3) and construction (e.g., insulated conductor 402, core 404, of the like, described in FIG. 4) of each of the eight coils 210a-h.

At 606, a second current may be concurrently provided to coils adjacent to the two opposing coils (selected at 604) to form a magnetic field having a plurality of magnetic field lines that are substantially planar and substantially parallel, as discussed above. The magnetic field lines may further be substantially planar and substantially parallel throughout a region of the magnetic field disposed above substrate support 124 of the process chamber 100.

The amount of current provided to the four coils 210b, 210d, 210f, 210h may be any amount suitable to produce the magnetic field 117 having a desired shape. In some embodiments, a ratio of the first current to the second current may be varied to adjust the shape and/or contours of the magnetic field lines 230 within the magnetic field 117, as discussed above.

In some embodiments, during processing of the substrate 122, the orientation of the magnetic field 117 may be changed to alter the orientation of the plasma. In such embodiments, the current supplied to the selected coils (e.g., the two coils (e.g., coils 210c, 210g) and the four coils (e.g., coils 210b, 210d, 210f, 210h)) may be stopped and then the respective currents may be applied to another six of the eight coils 210a-h in a manner similar to that described above. In such embodiments, the direction of the electron beam 121 may also be similarly changed to ensure the electron beam 121 remains parallel with the magnetic field lines 230 of the magnetic field 117.

After providing the second current at 606, the method 600 generally ends, unless the step of 608 is performed. In embodiments where a plasma is formed within the process chamber, the magnetic field 117 magnetically confines the electrons of the electron beam 121 and/or the plasma (as discussed above), thereby facilitating control over the plasma, thus facilitating control over the plasma assisted process. In such embodiments, following the end of the method 600, a plasma assisted process (e.g., an etch, deposition, anneal process, or the like) may also be terminated.

Returning to FIG. 1, a controller 130 may be coupled to the process chamber 100 to facilitate control over the process chamber 100. The controller 130 may be one of any form of general-purpose computer processor that can be used in an industrial setting for controlling various chambers and sub-processors. The memory 136, or computer-readable medium of the CPU 132 may be one or more of readily available memory such as random access memory (RAM), read only memory (ROM), floppy disk, hard disk, or any other form of digital storage, local or remote. The support circuits 134 are coupled to the CPU 132 for supporting the processor in a conventional manner. These circuits include cache, power supplies, clock circuits, input/output circuitry and sub-systems, and the like.

The inventive methods disclosed herein may generally be stored in the memory 136 as a software routine that, when executed by the CPU 132, causes the process chamber 101 to perform processes of the present invention. The software routine may also be stored and/or executed by a second CPU (not shown) that is remotely located from the hardware being controlled by the CPU 132. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 132, transforms the general purpose computer into a specific purpose computer (controller) that controls the chamber operation such that the methods disclosed herein are performed.

Figure 7:
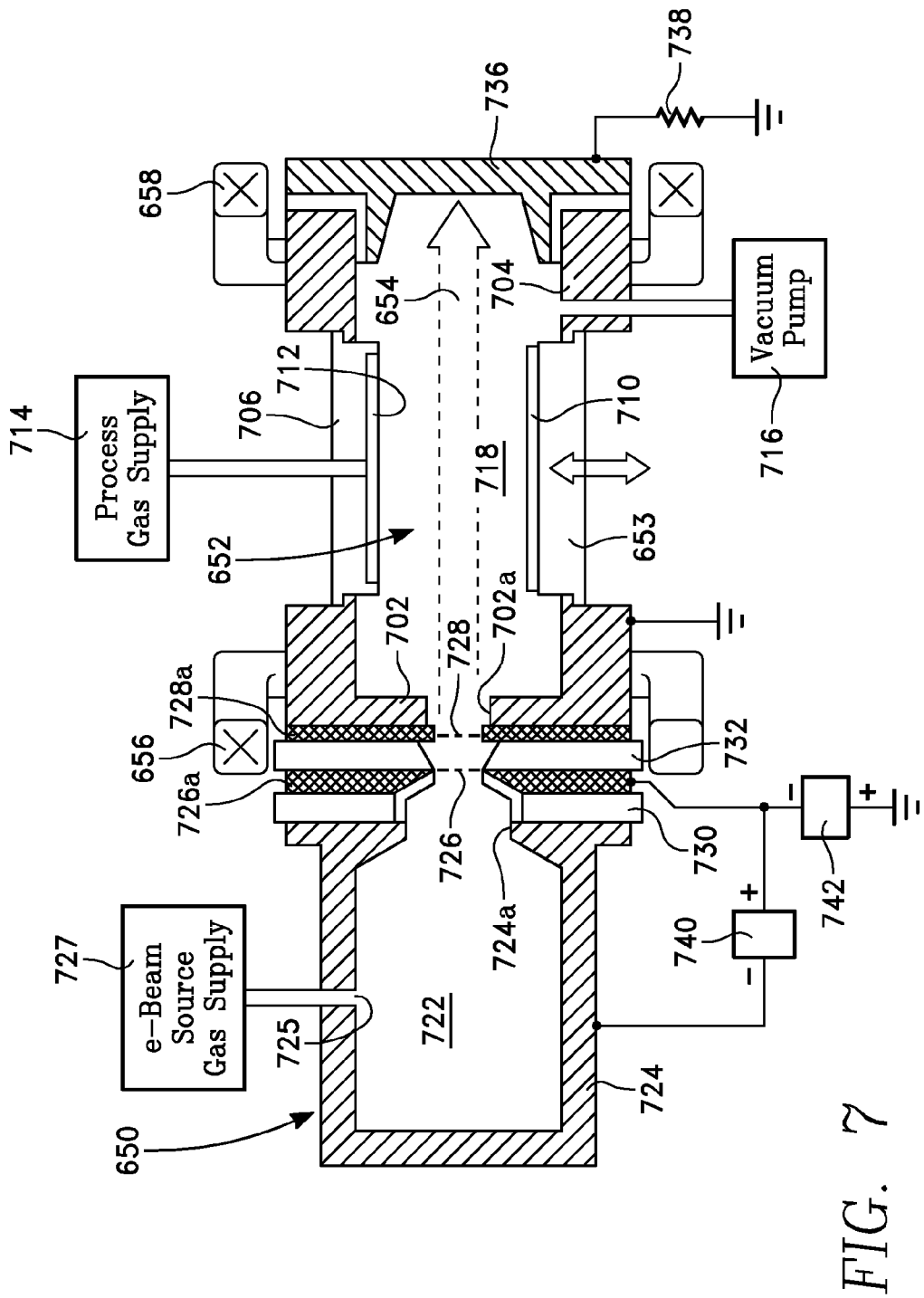
FIG. 7 depicts a plasma reactor employing a pair of folded electromagnets.

FIG. 7 depicts a plasma reactor having an electron beam generator 650 as a plasma source that produces plasma from process gases within a processing chamber 652. The electron beam 654 produced by the electron beam generator 650 is confined along a straight path by the magnetic field produced by a pair of electromagnets 656 and 658 facing one another. A workpiece support 653 is disposed within the processing chamber 652 for holding a workpiece or wafer in a support plane at least approximately parallel to the direction of the electron beam 654.

Figure 7A:
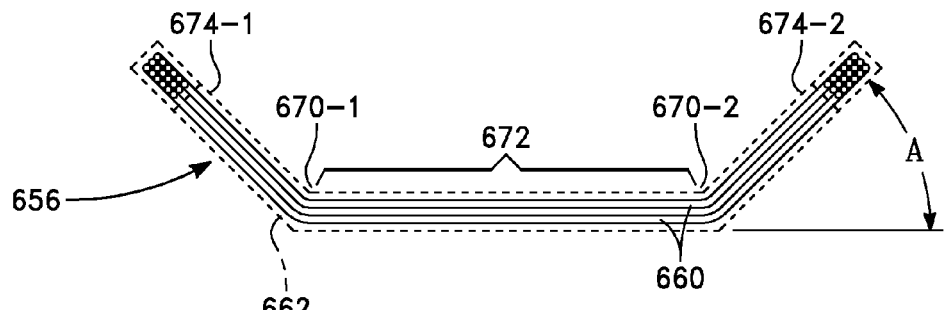
FIGS. 7A and 7B are top and end views of one of the folded electromagnets of FIG. 7.
Figure 7B:
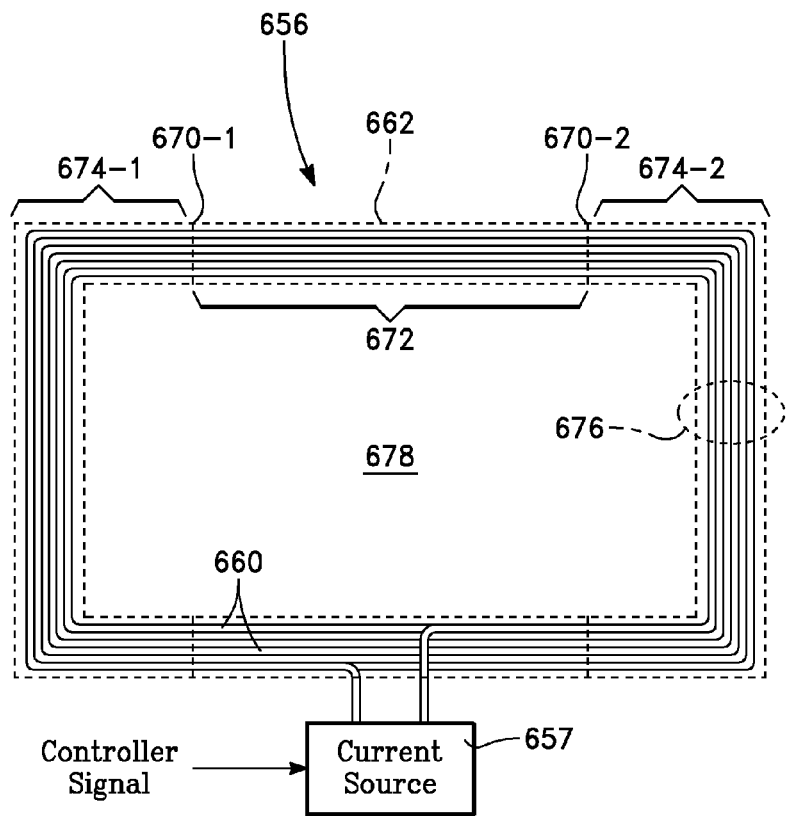

Referring to FIGS. 7A and 7B, the electromagnet 656 consists a continuous conductive winding 660 extending along the periphery of a folded rectangular frame 662 shown in dashed line. A controlled electric current source 657 is coupled to the winding 660. The rectangular frame 662 is folded along folds 670-1 and 670-2 defining a base 672 and a pair of folded wings 674-1 and 674-2 extending from opposite sides of the base 672. Each folded wing 674-1 and 674-2 is disposed at a fold angle A relative to the base 672. In one embodiment, the plane of the base 672 is orthogonal to the direction of the electron beam 654.

As shown in FIG. 7B, the conductive winding 660 is confined within a folded annular region 676 conforming to the folded rectangular frame 662. The folded annular region 676 of FIG. 7B defines an opening or aperture 678 through which the electron beam generator 650 faces toward the processing chamber 652, as will be described below. The aperture 678 is bounded in width between the outer edges of the wings 674-1 and 674-2. The electron beam 654 has a width up to the width of the aperture 678 and may therefore exceed the width of the base 672. This corresponds to the widened electron beam source 650' indicated in dashed line in FIG. 7E. This aspect allows for a large electron beam width, a significant advantage.

Figure 7C:
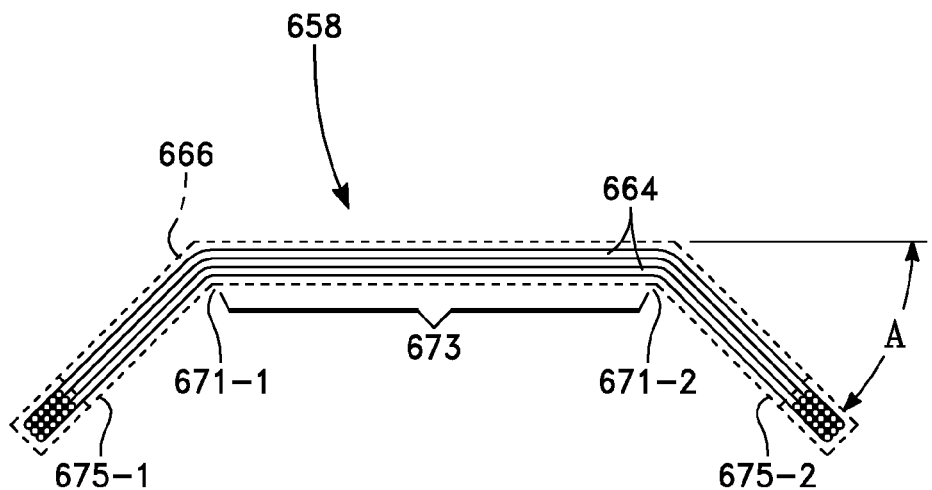
FIGS. 7C and 7D are top and end views of the other one of the folded electromagnets of FIG. 7.
Figure 7D:
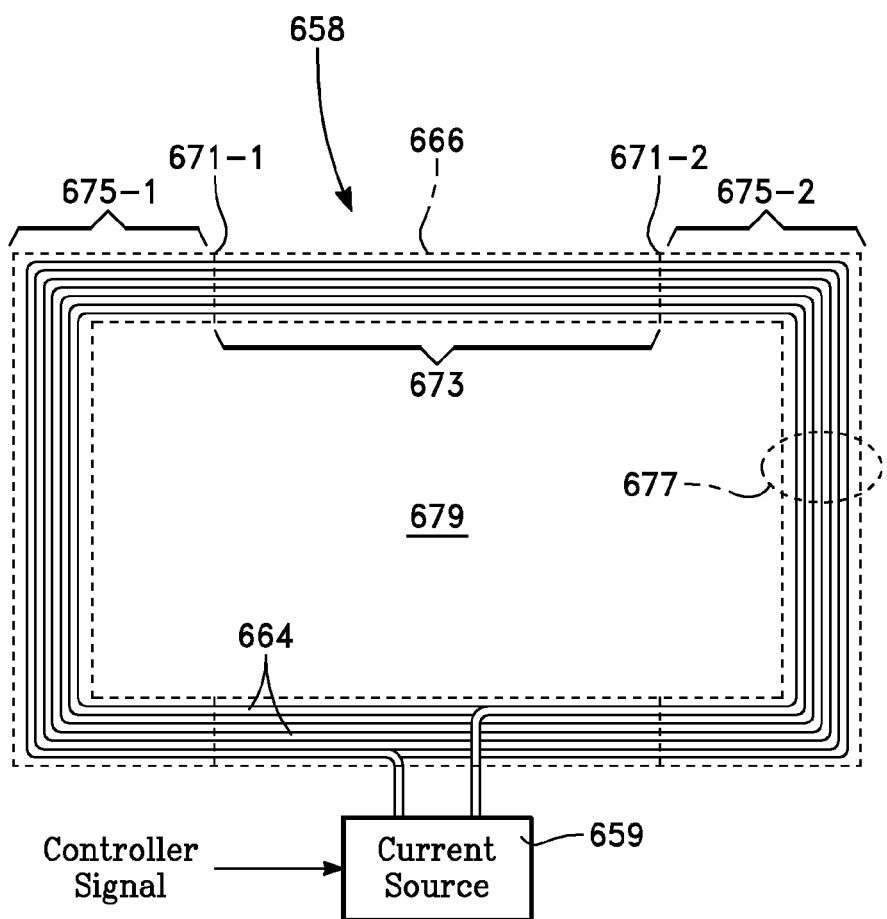

Referring now to FIGS. 7C and 7D, the electromagnet 658 consists a continuous conductive winding 664 extending along the periphery of a folded rectangular frame 666 shown in dashed line. A controlled electric current source 659 is coupled to the winding 664. The rectangular frame 666 is folded at folds 671-1 and 671-2 defining a base 673 and a pair folded wings 675-1 and 675-2 extending from opposite sides of the base 673. Each folded wing 675-1 and 675-2 is disposed at a fold angle A relative to the base 673. In one embodiment, the plane of the base 673 is orthogonal to the direction of the electron beam 654.

As shown in FIG. 7D, the conductive winding 664 is confined within a folded annular region 677 conforming to the folded rectangular frame 666. The folded annular region 677 of FIG. 7D defines an opening or aperture 679 through which a beam dump 736 (FIG. 7) receives the electron beam 654. The aperture 679 is bounded in width between the outer edges of the wings 675-1 and 675-2. The electron beam 654 may have a width up to the width of the aperture 679, allowing for a large electron beam width.

Figure 7E:
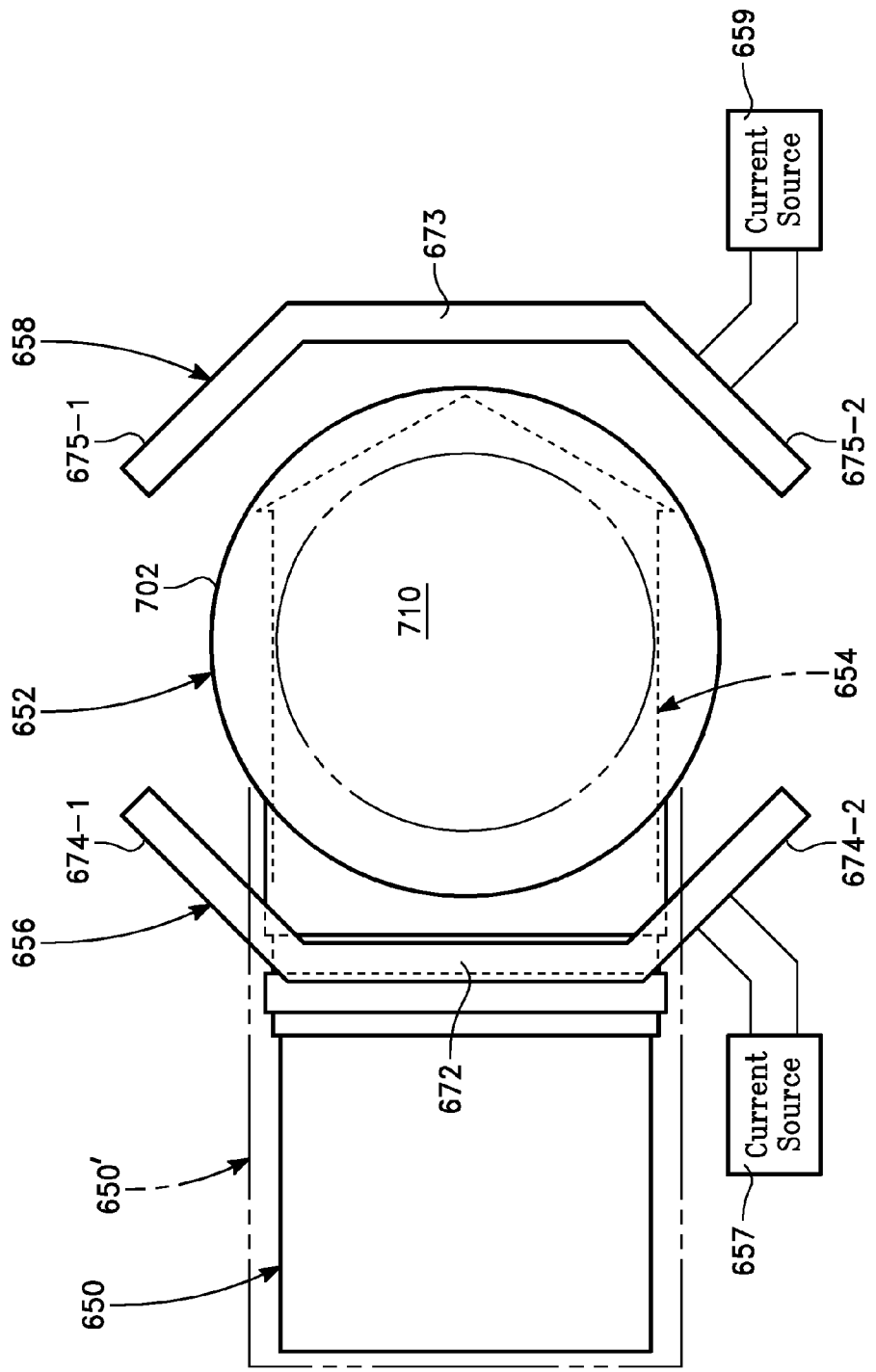
FIG. 7E is a top view the reactor of FIG. 7.

FIG. 7E shows how the wings 674-1, 674-2, 675-1 and 675-2 are folded toward the processing chamber 652. The folded electromagnets 656 and 658 in one embodiment are mirror images of one another and together define an axis of symmetry coinciding with an axis of symmetry of the processing chamber 652. Current flow in the conductive windings 660 and 664 is along the same rotational direction about an axis coinciding with the direction of the electron beam 654. In the illustrated example, the current flow in the conductive windings 660 and 664 is clockwise when viewed along the electron beam direction of travel. Thus, viewed along the direction of the electron beam 654, current flow along the top edge of each electromagnet 656, 658 is from left to right, while current flow along the bottom edge is from right to left.

Figure 7F:
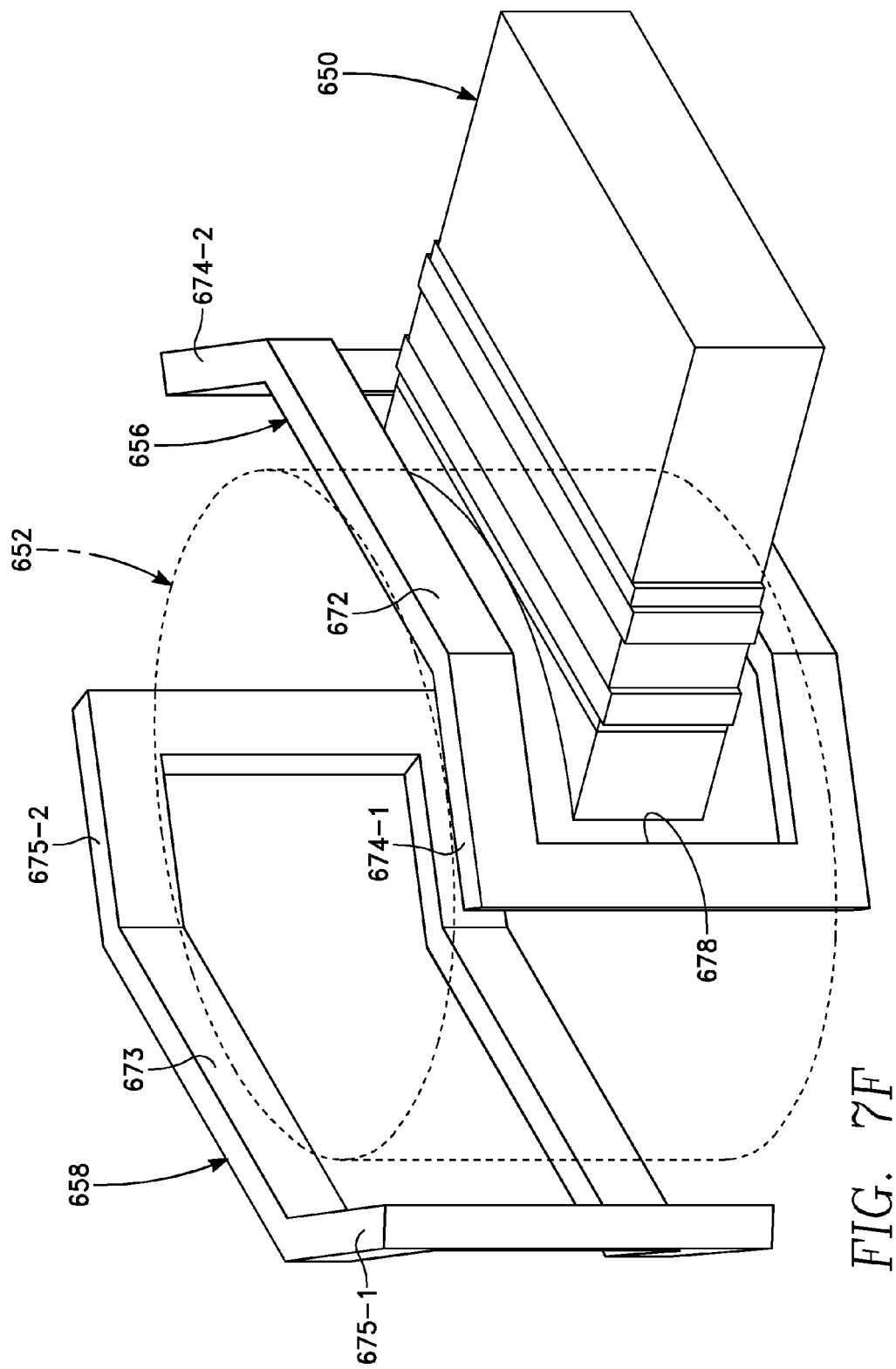
FIG. 7F is an orthographic projection corresponding to FIG. 7E and depicting insertion of an electron beam source into an aperture of an electromagnet.

FIG. 7F is a view showing how the electron beam generator 650 faces the processing chamber 652 through the aperture 678 of the electromagnet 656. In some embodiments, the electron beam generator 650 extends partially through the aperture 678.

Referring again to FIG. 7, the processing chamber 652 has a cylindrical side wall 702, a floor 704 and a ceiling 706. A workpiece support or pedestal 653 supports a workpiece 710, such as a semiconductor wafer, the pedestal 653 being movable in the axial (e.g., vertical) direction. A gas distribution plate 712 is integrated with or mounted on the ceiling 706, and receives process gas from a process gas supply 714. A vacuum pump 716 evacuates the chamber through a passage in the floor 704. A processing region 718 is defined between the workpiece 710 and the gas distribution plate 712. Within the processing region 718, the process gas is ionized to produce a plasma for processing of the workpiece 710.

The plasma is generated in the processing region 718 by the electron beam 654 from the electron beam generator or source 650. The electron beam source 650 in one embodiment includes a plasma generation chamber 722 spaced from the processing chamber 652 and having a conductive enclosure 724. The conductive enclosure 724 has a gas inlet 725. An electron beam source gas supply 727 is coupled to the gas inlet 725. The conductive enclosure 724 has an opening 724a facing the processing region 718 through an opening 702a in the sidewall 702.

The electron beam source 650 in the illustrated embodiment includes an extraction grid 726 adjacent the opening 724a, and an acceleration grid 728 adjacent the extraction grid 726 and facing the processing region 718. Either or both the extraction grid 726 and the acceleration grid 728 may be formed as either a conductive mesh or a slotted electrode, for example, and are herein referred to generically as grids. Electrical contact to the extraction grid 726 is provided by a conductive ring 726a surrounding the extraction grid. Electrical contact to the acceleration grid 728 is provided by a conductive ring 728a surrounding the acceleration grid 728. The extraction grid 726 and the acceleration grid 728 are mounted with insulators 730, 732, respectively, so as to be electrically insulated from one another and from the conductive enclosure 724. However, the acceleration grid 728 is in electrical contact with the side wall 702 of the chamber 652. The openings 724a and 702a and the extraction and acceleration grids 726, 728 can be mutually congruent, generally, and define a thin wide flow path for an electron beam 654 into the processing region 718. The width of the flow path is about the diameter of the workpiece 710 (e.g., 300 mm) or more, while the height of the flow path is less than about two inches.

The electron beam flows across the processing region 718 over the workpiece 710, and is absorbed on the opposite side of the processing region 718 by the beam dump 736. The beam dump 736 is a conductive body having a shape adapted to capture the wide thin electron beam. The beam dump 736 may be coupled to ground through a shunt resistor 738.

A negative terminal of a plasma D.C. discharge voltage supply 740 is coupled to the conductive enclosure 724, and a positive terminal of the voltage supply 740 is coupled to the extraction grid 726. A negative terminal of an electron beam acceleration voltage supply 742 is connected to the extraction grid 726, and a positive terminal of the voltage supply 742 is connected to the ground. In one embodiment the acceleration grid 728 is grounded. The acceleration voltage supply 742 is connected across the extraction grid 726 and the acceleration grid 728. In one embodiment, plasma is generated within the chamber 722 of the electron beam source 650 by a D.C. gas discharge produced by power from the voltage supply 740. Electrons are extracted from the plasma in the chamber 722 through the extraction grid 726 and the acceleration grid 728 to produce an electron beam that flows into the processing chamber 652. Electrons are accelerated to energies corresponding to the voltage provided by the acceleration voltage supply 742.

The electron beam source 650 has been described as a D.C. gas discharge plasma source. In other embodiments, the electron beam source 650 may embody any other suitable plasma source, such as a capacitively coupled plasma source, an inductively coupled plasma source or a toroidal plasma source.

Figure 8:
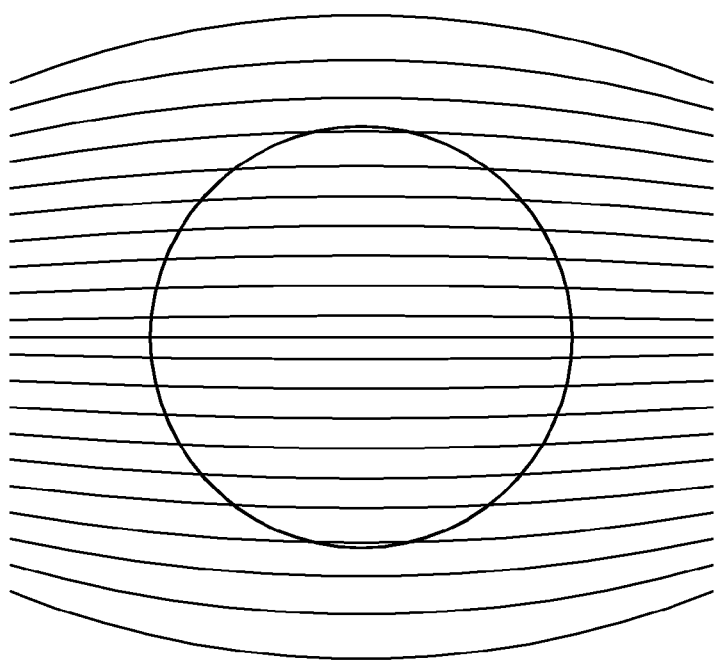
FIG. 8 depicts a graph of electron flux lines of an electron beam in a processing region of the plasma reactor of FIG. 7.

In some instances, the magnetic field produced by the electromagnets 656 and 658 of FIG. 7 can be non-uniform. In such cases, plasma production and transport are non-uniform, leading to significant plasma non-uniformity in the processing chamber 652. Along a direction transverse to the central axis of the electromagnets 656, 658, the magnetic field lines curve. Since the electrons follow the magnetic field lines, beam electrons follow a curved trajectory and electron flux density in the electron beam decreases with distance from the central axis of the electron beam 654, as shown in the graph of FIG. 8. In addition, due to curvature in the magnetic fields lines, electrons in the electron beam follow a path that twists up and down. As a result of these effects, plasma is produced non-uniformly, which detracts from process uniformity in the processing chamber 652.

Figure 9:
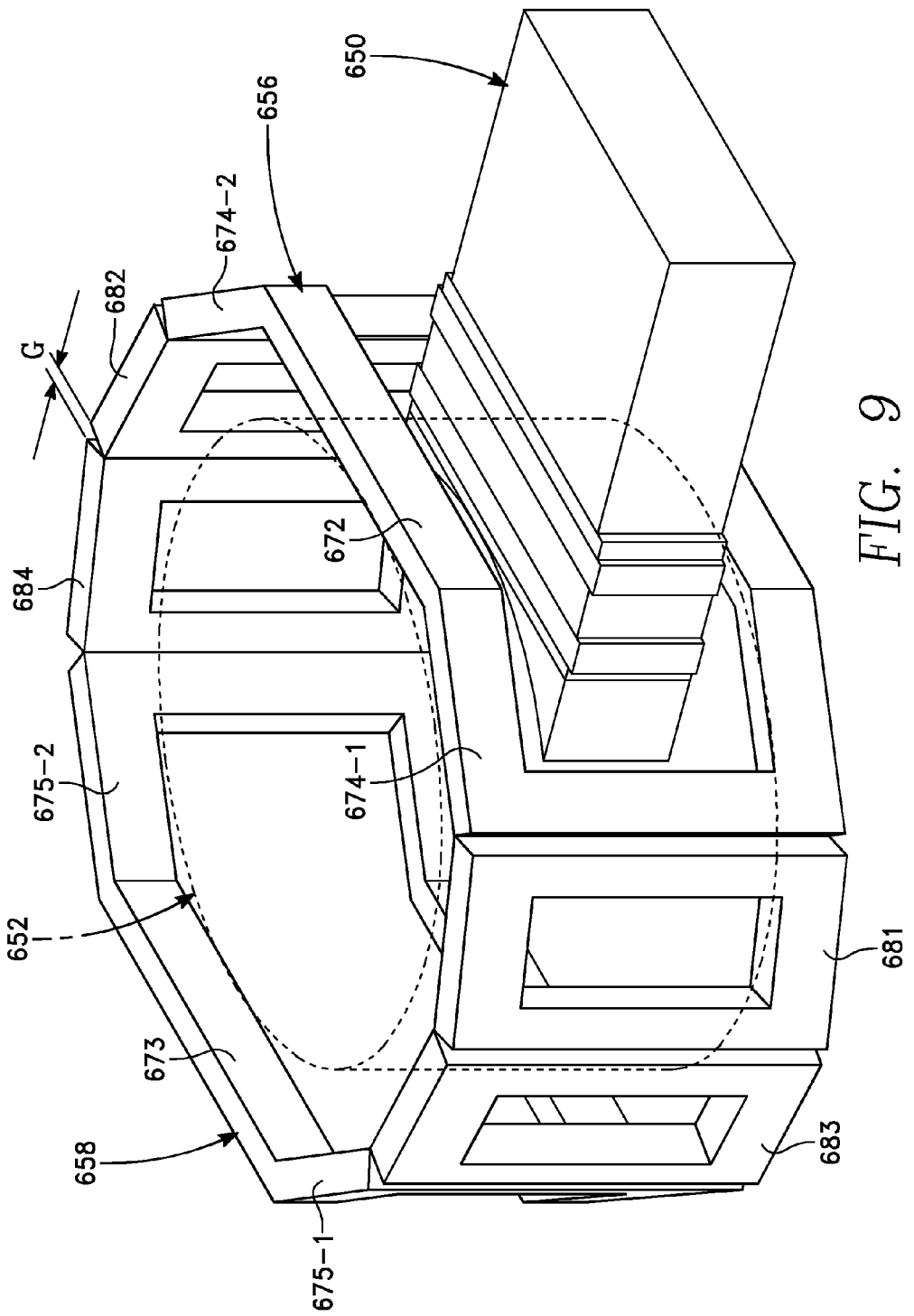
FIG. 9 depicts a plasma reactor having a pair of folded electromagnets flanked by side electromagnets.
Figure 9A:
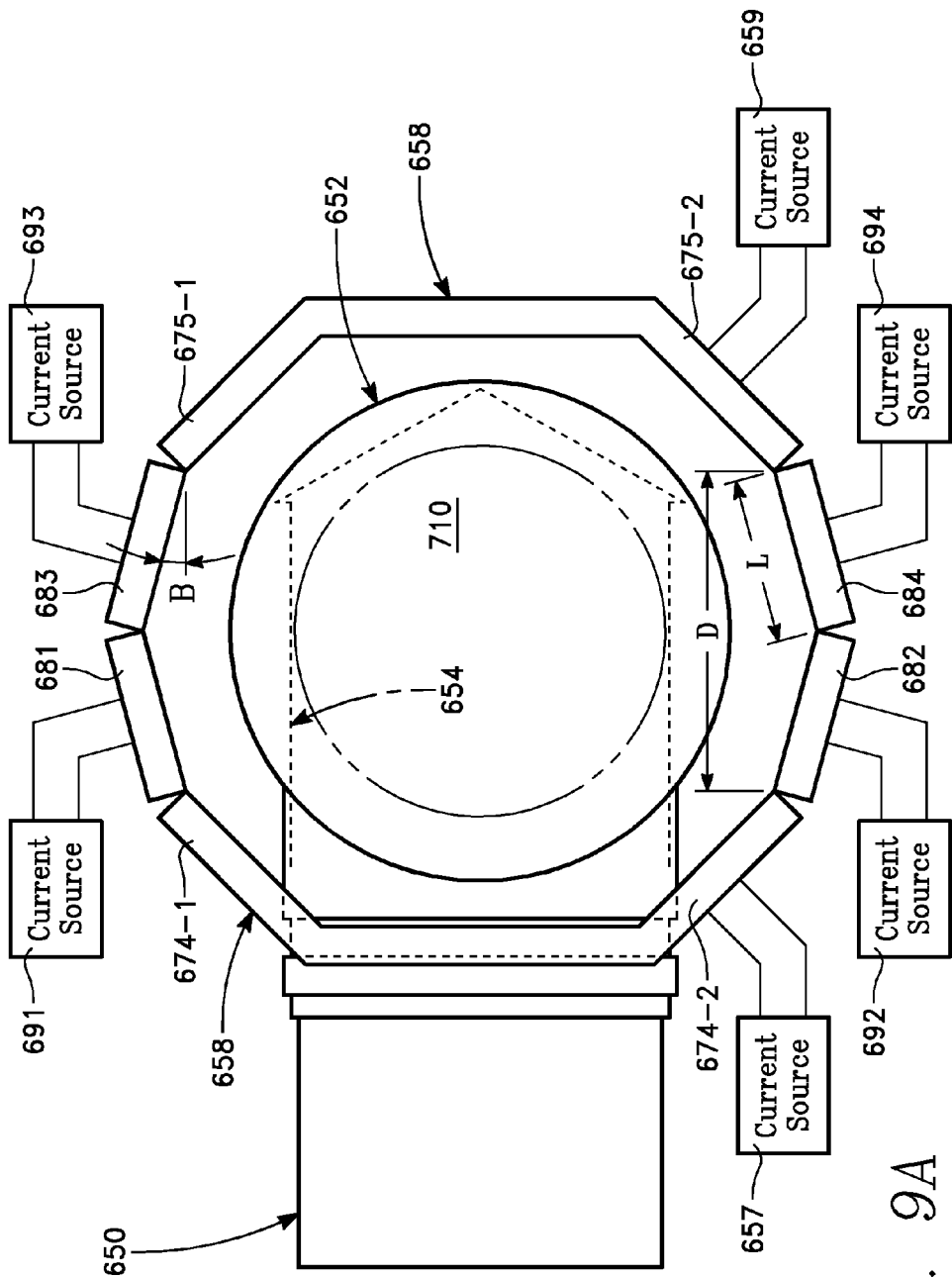
FIG. 9A is a top view corresponding to FIG. 9.
Figure 9B:
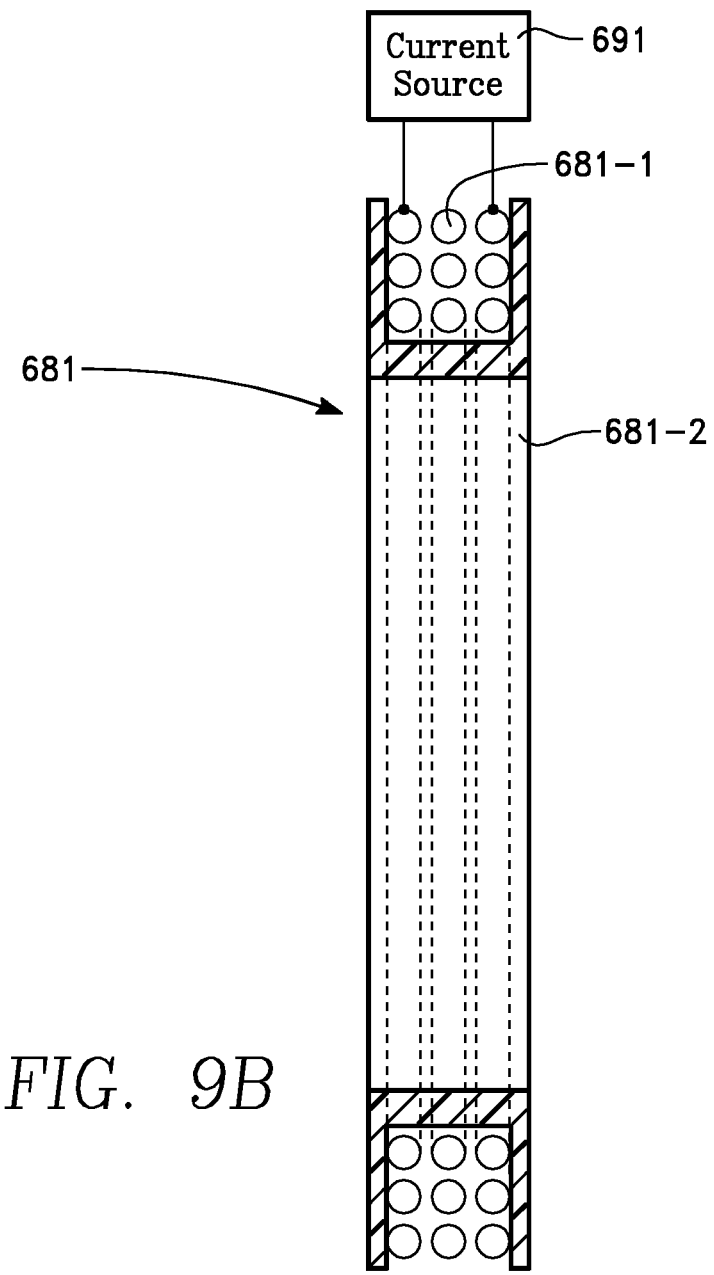
FIG. 9B is a side view of a side electromagnet of FIG. 9.

FIG. 9 depicts an embodiment in which the foregoing problem is solved, by the addition of side electromagnets 681, 682, 683, 684 between the electromagnets 656 and 658. Referring to FIG. 9A, the side electromagnets 681 and 682 extend from the outer edges of the folded wings 674-1 and 674-2 respectively in a direction generally tangential to the edge of the processing chamber 652. The side electromagnets 683 and 684 extend from the outer edges of the folded wings 675-1 and 675-2 respectively in a direction generally tangential to the edge of the processing chamber 652. In the illustrated embodiment, each of the of side electromagnets 681, 682, 683, 684 is rectangular in shape and supported on an individual rectangular frame and are identical design. FIG. 9B illustrates the structure of the side electromagnet 681, which is typical all four side electromagnets 681, 682, 683, 684. The side electromagnet 681 consists of an elongate conductor 681-1 wound around the outer edge of a rectangular frame 681-2.

Each side electromagnet 681, 682, 683, 684 extends about half the distance of each gap D separating opposing pairs of the folded wings 674-1, 675-1 and 674-2, 675-2. Each side electromagnet 681, 682, 683, 684 may be articulated at an angle "B" relative to the direction of the electron beam 654, as indicated in FIG. 9A. The angle B can be changed to optimize electron beam uniformity or minimize curvature of the magnetic field.

Figure 9C:
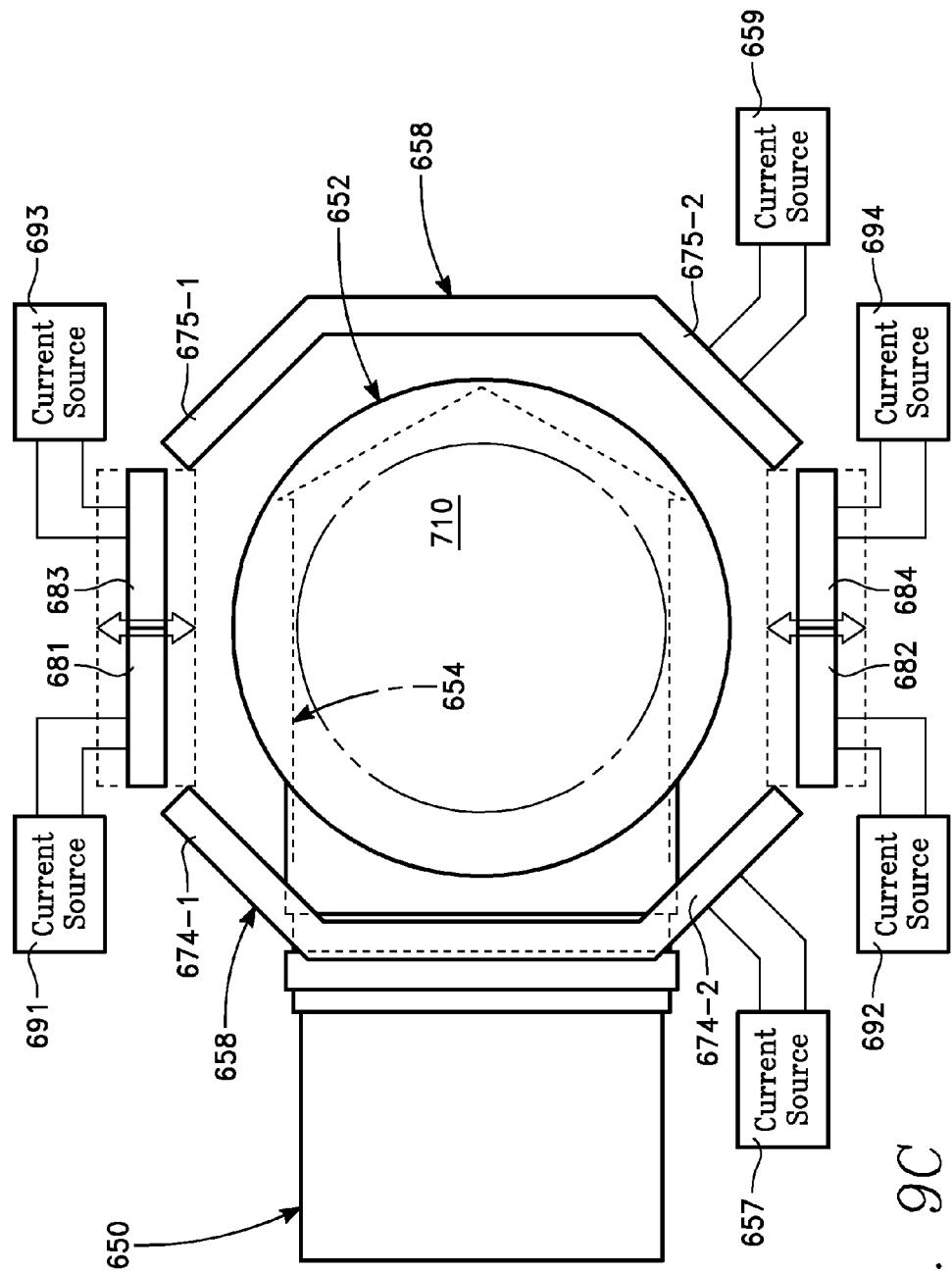
FIG. 9C is another top view depicting an alternative mode for controlling electron flux distribution.

FIG. 9C depicts another way of optimizing uniformity or minimizing magnetic field curvature, by shifting the location of each pair of side electromagnets 681, 682, 683, 684 relative to the axis of symmetry of the processing chamber 652.

Figure 10:
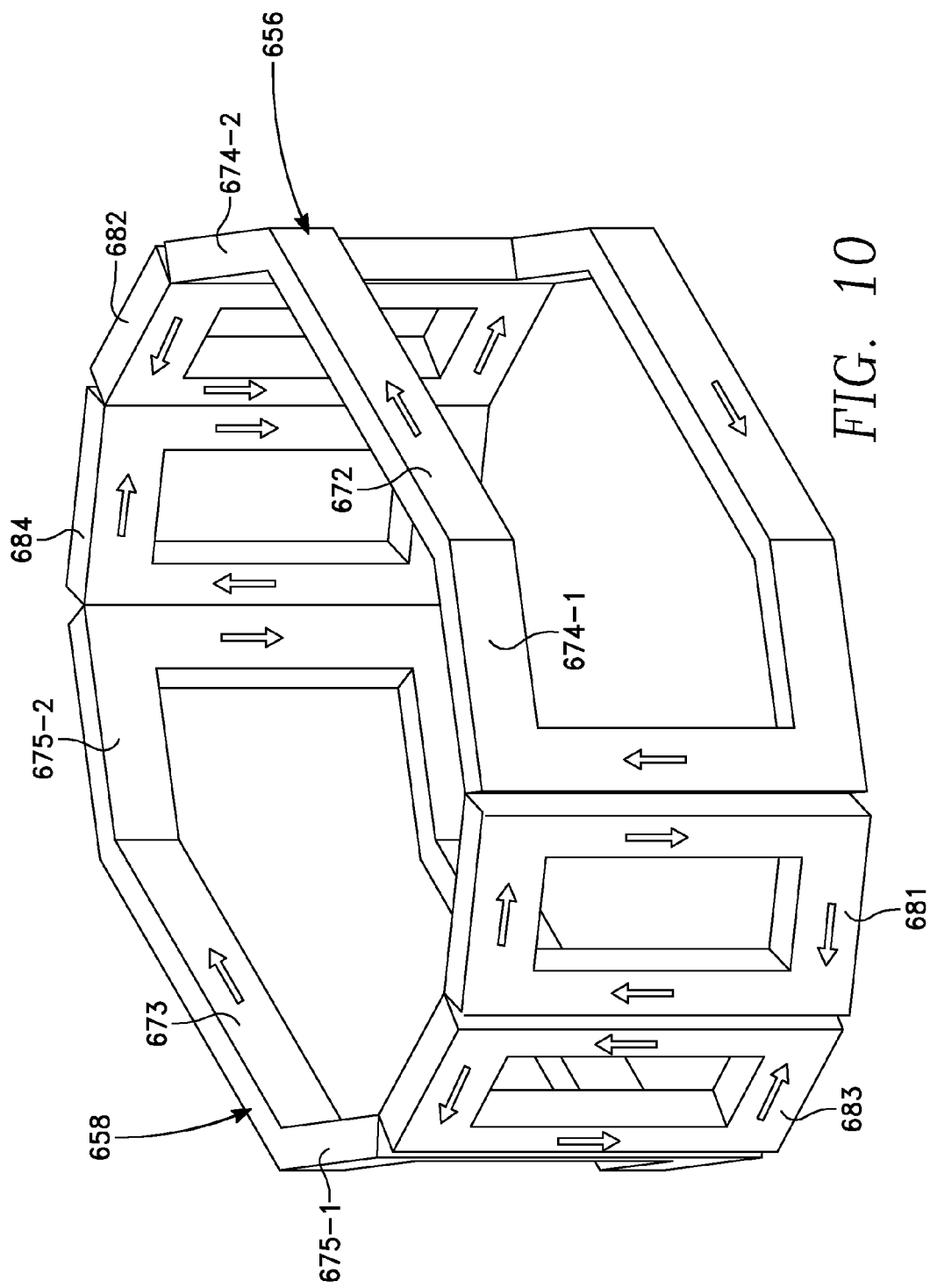
FIG. 10 is a simplified orthographic projection depicting current flow direction in each electromagnet of FIG. 9, in accordance with one mode.

Referring now to FIG. 10, the current flow direction (indicated by arrows) along the top edge of each side electromagnet 681, 682 is the same as the direction of current flow along the top edge of the adjacent folded wing 674-1, 674-2 respectively. Similarly, the current flow direction along the top edge of each side electromagnet 683, 684 is the same as the direction of current flow along the top edge of the adjacent folded wing 675-1, 675-2 respectively. Respective current sources 691, 692, 693, 694 are separately controlled and connected to respective ones of the side electromagnets 681, 682, 683, 684. FIG. 9B shows how the current source 691 is connected to opposite ends of the coiled conductor 681-2 of the side electromagnet 681.

In the mode depicted in FIG. 10, the current sources 657, 659, 691, 692, 693, 694 are controlled to provide current flow in each electromagnet 656, 658, 681, 682, 683, 684 such that net current flow viewed along the direction of electron beam propagation is clockwise. Thus, viewed along the direction of the electron beam 654, current flow along the top edge of the electromagnet 656 and its side electromagnets 681, 682 is from left to right, while current flow along the bottom edge is from right to left. Similarly, viewed along the direction of the electron beam 654, current flow along the top edge of the electromagnet 658 and its side electromagnets 683, 684 is from left to right, while current flow along the bottom edge is from right to left.

Figure 11:
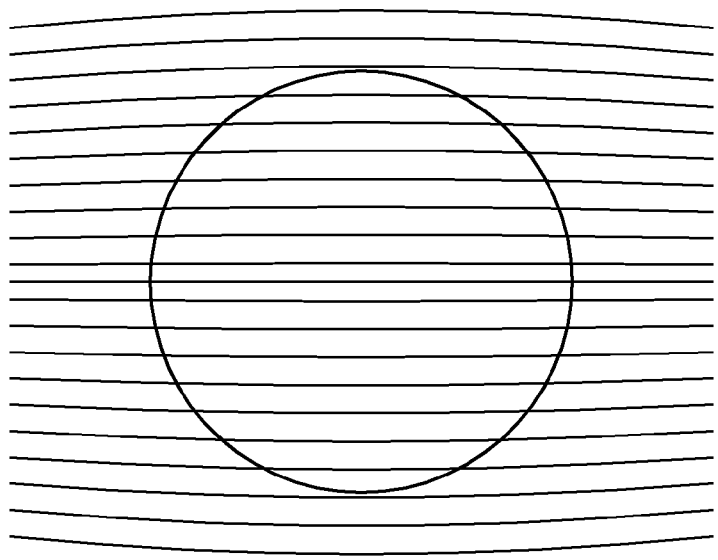
FIG. 11 depicts a graph of electron flux lines of an electron beam in a processing region of the plasma reactor of FIG. 9, showing an improved electron distribution.

By exciting the side electromagnets 681, 682, 683, 684 with appropriate currents, they produce a magnetic field that opposes or compensates for the magnetic field curvatures produced by the electromagnets 656 and 658, and so achieve a more uniform distribution in the electron beam 654 (as illustrated in the graph of FIG. 11) and of plasma in the processing chamber 652. In addition, as the resulting magnetic field lines have less curvature, the up/down twisting of the beam electrons is also minimized. The side electromagnets 681, 682, 683, 684 provide the following variable parameters to optimize the performance: their length "L", the angle B, current magnitude, and current direction. These variable parameters enhance control of the magnetic field distribution. By shaping the magnetic field using the side electromagnets 681, 682, 683, 684, the etch uniformity can also be improved. The magnetic field can be optimized electrically by separately powering the electromagnets 656, 658 and the side electromagnets 681, 682, 683, 684 and controlling the ratio of their electromagnet coil currents.

In the illustrated embodiment, the electromagnets 656, 658 and the side electromagnets 681, 682, 683, 684 together form a polygon or at least a portion of a polygon within which the circular boundary of the processing chamber is at least approximately inscribed. The polygon may be irregular in that not all sides are of the same length. In some embodiments, the opposing pairs of side magnets touch one another so that the polygon is closed. In other embodiments there is a gap G between each pair of opposing side magnets, and the polygon is not closed. Such differences are affected by the angle A and length L of the different side electromagnets 681, 682, 683, 684.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
    a processing chamber and a workpiece support surface inside said processing chamber;
    an electron beam generator having an electron beam emission axis extending into said processing chamber along a direction parallel to said workpiece support surface;
    a pair of electron beam-confining electromagnets aligned with said electron beam emission axis, each of said electromagnets comprising:
       a frame comprising an edge folded to define a main section and a pair of angled wing sections disposed at respective angles relative to said main section;
       a conductor extending along the edge of said frame and conforming to said respective angles of said angled wing sections; and
    wherein said conductor is confined in an annular zone along said edge of said frame defining an aperture extending between opposite edges of said frame, said electron beam emission axis extending through the aperture of one of said electromagnets.

2. The plasma reactor of claim 1 further comprising first and second DC current sources coupled to first and second ones of said electromagnets respectively, and a controller governing said first and second DC current sources.

3. The plasma reactor of claim 1 wherein said electron beam generator provides an electron beam having a width less than a distance between opposing edges of said angled wing sections.

4. The plasma reactor of claim 3 wherein said width of said electron beam exceeds a width of said main section of said frame.

5. The plasma reactor of claim 1 wherein said angled wing sections are folded about respective fold axes which are parallel to an axis of symmetry of the chamber.

6. The plasma reactor of claim 1 wherein each of said pair of electromagnets extends around a portion of a periphery of said chamber.

7. The plasma reactor of claim 6 wherein said pair of electromagnets defines respective portions of a polygon within which a circular boundary of said processing chamber is inscribed.

8. The plasma reactor of claim 1 wherein each angled wing section of one of said electromagnets is separated by a gap from the corresponding angled wing section of the other one of said electromagnets, whereby respective pairs of angled wing sections are separated by respective gaps.

9. The plasma reactor of claim 8 further comprising respective pairs of side electromagnets extending at least partially across respective ones of said gaps, each of said side electromagnets extending from a corresponding one of said angled wing sections into the respective gap.

10. The plasma reactor of claim 9 wherein each one of said pair of side electromagnets extends across the entirety of the corresponding one of said gaps.

11. The plasma reactor of claim 9 wherein each of said side electromagnets is oriented at an angle relative to said electron beam emission axis.

12. The plasma reactor of claim 9 wherein said pair of electromagnets and said side electromagnets together define a complete polygon within which a circular boundary of said processing chamber is inscribed.

13. The plasma reactor of claim 9 further comprising respective DC current sources coupled to respective ones of said side electromagnets.

14. The plasma reactor of claim 13 wherein said DC current sources are such that current flow direction along a top edge of each electromagnet is co-directional with current flow along the top edge of the corresponding one of said folded wing sections.

15. The plasma reactor of claim 1 wherein said electron beam generator extends partially into said aperture.

16. A plasma reactor comprising:
a processing chamber;
an electron beam generator having an electron beam emission axis extending into said processing chamber in a direction parallel to a top surface of a workpiece disposed in said processing chamber;
a pair of electron beam-confining electromagnets aligned with said electron beam emission axis, each of said electromagnets comprising:
a conductor coiled around a closed boundary, said closed boundary comprising an edge folded to define a main section and a pair of angled wing sections disposed at respective angles relative to said main section, said boundary defining an aperture through which said electron beam emission axis extends.

17. The plasma reactor of claim 16 wherein each angled wing section of one of said electromagnets is separated by a gap from the corresponding angled wing section of the other one of said electromagnets, said plasma reactor further comprising:
respective pairs of side electromagnets extending at least partially across respective ones of said gaps, each of said side electromagnets extending from a corresponding one of said angled wing sections into said gap.

* * * * *